(12) United States Patent
Kim et al.

(10) Patent No.: US 12,132,072 B2
(45) Date of Patent: Oct. 29, 2024

(54) DISPLAY DEVICE AND METHOD OF FABRICATING THE SAME

(71) Applicant: Samsung Display Co., LTD., Yongin-si (KR)

(72) Inventors: Si Kwang Kim, Daegu (KR); Min Suk Ko, Cheonan-si (KR); Kab Jong Seo, Hwaseong-si (KR); Yong Hoon Yang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/329,326

(22) Filed: Jun. 5, 2023

(65) Prior Publication Data
US 2023/0317769 A1 Oct. 5, 2023

Related U.S. Application Data

(62) Division of application No. 17/084,278, filed on Oct. 29, 2020, now Pat. No. 11,705,477.

(30) Foreign Application Priority Data
Mar. 3, 2020 (KR) .................. 10-2020-0026409

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/38* (2013.01); *H01L 33/40* (2013.01); *H01L 2933/0016* (2013.01)

(58) Field of Classification Search
CPC . H01L 25/0753; H01L 27/156; H01L 25/167; H01L 27/15; H01L 2924/12041;
(Continued)

(56) References Cited

U.S. PATENT DOCUMENTS 6,853,013 B2 2/2005 Hirai et al.
9,490,042 B2 11/2016 Tsai et al.
(Continued)

FOREIGN PATENT DOCUMENTS

EP 1 456 856 9/2004
EP 1 456 856 B1 5/2005
(Continued)

OTHER PUBLICATIONS

Extended European Search Report dated Sep. 10, 2021 for corresponding European Patent Application No. 21156126.1 (13 pages).
(Continued)

*Primary Examiner* — Mark W Tornow
*Assistant Examiner* — Priya M Rampersaud
(74) *Attorney, Agent, or Firm* — Lewis Roca Rothgerber Christie LLP

(57) ABSTRACT

A display device and a method of fabricating the same are provided. The display device includes a substrate, a first electrode on the substrate, a second electrode on the substrate and spaced apart from the first electrode, a plurality of light emitting elements, at least a portion of each of which is between the first electrode and the second electrode, and contact electrodes on the first electrode, the second electrode and the light emitting elements, the contact electrodes including a conductive polymer, wherein the contact electrodes include a first contact electrode which contacts an end portion of a first portion of the light emitting elements and the first electrode and a second contact electrode which contacts an end portion of a second portion of the light emitting elements, and the second electrode and is spaced apart from the first contact electrode.

5 Claims, 22 Drawing Sheets

(51) Int. Cl.
*H01L 33/38* (2010.01)
*H01L 33/40* (2010.01)

(58) Field of Classification Search
CPC . H01L 24/00; H01L 33/00; H01L 2933/0016;
H01L 33/38; H01L 2933/0066; H01L
33/005; H01L 33/60; H01L 33/405; H01L
2933/0025; H01L 33/0095; H01L 33/387;
H01L 33/385; H01L 27/1259; H01L
21/44; H01L 21/68; H01L 21/76838;
G09G 3/32; G09G 3/3208; G09G
2300/0426; H10K 2102/3031; H10K
2102/3026; H10K 59/12; H10K 59/131;
H10K 50/805; H10K 50/814; H10K
50/818; H10K 59/805; H10K 59/80518;
H10K 71/00
See application file for complete search history.

(56) References Cited

U.S. PATENT DOCUMENTS

| | | | |
|---|---|---|---|
| 10,446,720 | B2 | 10/2019 | Hsu |
| 10,490,537 | B2 | 11/2019 | Bae et al. |
| 10,892,417 | B2 | 1/2021 | Song |
| 11,004,892 | B2 | 5/2021 | Kim et al. |
| 2012/0223922 | A1 | 9/2012 | Lee et al. |
| 2013/0134438 | A1* | 5/2013 | Ray ................. H01L 31/035281 257/432 |
| 2017/0317228 | A1* | 11/2017 | Sung ....................... H01L 33/08 |
| 2018/0012876 | A1* | 1/2018 | Kim ....................... H01L 33/387 |
| 2018/0019369 | A1* | 1/2018 | Cho ....................... H01L 27/156 |
| 2018/0026074 | A1 | 1/2018 | Lee et al. |
| 2018/0088072 | A1* | 3/2018 | Yakushenko ...... G01N 33/5438 |
| 2018/0175104 | A1* | 6/2018 | Kang .................... H01L 33/005 |
| 2018/0175106 | A1 | 6/2018 | Kim et al. |
| 2019/0115513 | A1* | 4/2019 | Im .......................... H05K 1/111 |
| 2019/0172819 | A1 | 6/2019 | Bae et al. |
| 2019/0244985 | A1 | 8/2019 | Kim et al. |
| 2019/0319168 | A1* | 10/2019 | Kim ......................... H01L 33/50 |
| 2021/0202803 | A1* | 7/2021 | Park ....................... H01L 33/44 |

FOREIGN PATENT DOCUMENTS

| | | |
|---|---|---|
| EP | 3 557 620 A1 | 10/2019 |
| EP | 3 608 958 A1 | 2/2020 |
| KR | 10-1672781 B1 | 11/2016 |
| KR | 10-2017-0110210 A | 10/2017 |
| KR | 10-2019-0098305 A | 8/2019 |
| KR | 10-2020-0016424 A | 2/2020 |
| WO | WO 2011/034908 A1 | 3/2011 |
| WO | WO 2019/114560 A1 | 6/2019 |

OTHER PUBLICATIONS

Si, Pengxiang et al.; "PEDOT:PSS nano-gels for highly electrically conductive silver/epoxy composite adhesives", Journal of Materials Science: Materials in Electronics, Chapman and Hall, London, GB, vol. 29, 2018, pp. 1837-1846.

* cited by examiner

DT : DT_ACT, DT_G, DT_SD1, DT_SD2
ST : ST_ACT, ST_G, ST_SD1, ST_SD2

DISPLAY DEVICE AND METHOD OF FABRICATING THE SAME

CROSS-REFERENCE TO RELATED APPLICATION

This application is a divisional of U.S. application Ser. No. 17/084,278, filed Oct. 29, 2020, which claims priority and the benefit of Korean Patent Application No. 10-2020-0026409, filed on Mar. 3, 2020 in the Korean Intellectual Property Office, the entire contents of all which are hereby incorporated by reference.

BACKGROUND

1. Field

Embodiments of the present disclosure relate to a display device and a method of fabricating the same.

2. Description of the Related Art

Display devices are becoming increasingly important with the development of multimedia. Accordingly, various types of display devices such as, for example, organic light emitting displays and liquid crystal displays are being used.

A display device is a device that displays an image and includes a display panel such as, for example, an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a fluorescent material or may be inorganic LEDs using an inorganic material as the fluorescent material.

SUMMARY

Aspects of embodiments of the present disclosure provide a display device which includes light emitting elements and contact electrodes electrically coupled to the light emitting elements and including a conductive polymer.

Aspects of embodiments of the present disclosure also provide a method of fabricating a display device through a reduced number of processes.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description of the present disclosure given below.

According to an embodiment of the present disclosure, a display device includes: a substrate, a first electrode on the substrate, a second electrode on the substrate and spaced apart from the first electrode, a plurality of light emitting elements, at least a portion of each of which is between the first electrode and the second electrode, and contact electrodes on the first electrode, the second electrode and the light emitting elements, the contact electrodes including a conductive polymer, wherein the contact electrodes include a first contact electrode which contacts an end portion of each of a first portion of the light emitting elements and the first electrode and a second contact electrode which contacts an end portion of each of a second portion of the light emitting elements and the second electrode and is spaced apart from the first contact electrode.

The conductive polymer may include poly(3,4-ethylenedioxythiophene)polystyrene sulfonate (PEDOT:PSS)

The conductive polymer of each of the contact electrodes may form a polymer matrix and silver (Ag) particles are dispersed in the polymer matrix.

Each of the contact electrodes may include a plurality of layers each including the conductive polymer.

A thickness of each of the contact electrodes may be in a range of 150 nm to 250 nm.

The first contact electrode and the second contact electrode may be spaced apart from each other on the light emitting elements.

A width of the first contact electrode may be greater than a width of the first electrode.

The display device may further include a third electrode between the first electrode and the second electrode, wherein the first portion of the light emitting elements may be between the first electrode and the third electrode and the second portion of the light emitting elements may be between the third electrode and the second electrode.

The contact electrodes further include a third contact electrode on the third electrode, the third contact electrode contacting at least one end portion of each light emitting element.

The display device may further include a plurality of first banks on the substrate, wherein the first electrode is on one of the first banks and the second electrode is on another one of the first banks, and wherein the light emitting elements are between the first banks.

The display device may further include a first insulating layer on the substrate and between the first electrode and the second electrode to partially cover the first electrode and the second electrode, wherein the light emitting elements are on the first insulating layer.

The display device may further include a second insulating layer on the substrate and covering the first electrode, the second electrode, the light emitting elements and the contact electrodes.

The second insulating layer may directly contact a portion of an outer surface of each light emitting element between the first contact electrode and the second contact electrode.

The display device may further include a second bank which is on the substrate to surround an area where the light emitting elements are located, wherein the second insulating layer may be also on the second bank.

According to another embodiment of the present disclosure, a method of fabricating a display device includes preparing a target substrate, a first electrode and a second electrode on the target substrate, and light emitting elements, at least a portion of each of which is between the first electrode and the second electrode, coating a conductive polymer solution on the first electrode, the light emitting elements, and the second electrode and forming contact electrodes by curing the conductive polymer solution.

The contact electrodes may include a first contact electrode which contacts an end portion of each of a first portion of the light emitting elements and the first electrode and a second contact electrode which contacts an end portion of each of a second portion of the light emitting elements, wherein the second contact electrode is spaced apart from the first contact electrode.

The forming of the contact electrodes may include forming a conductive polymer layer by curing the conductive polymer solution and forming the first contact electrode and the second contact electrode by partially removing the conductive polymer layer.

The light emitting elements are dispersed in the conductive polymer solution and then on the first electrode and the second electrode.

The conductive polymer may include PEDOT:PSS.

The conductive polymer of each of the contact electrodes may form a polymer matrix, and silver (Ag) particles may be dispersed in the polymer matrix.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Embodiments of the present disclosure will now be described more fully hereinafter with reference to the accompanying drawings, in which example embodiments of the present disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the subject matter of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Hereinafter, embodiments will be described with reference to the accompanying drawings.

Figure 1:
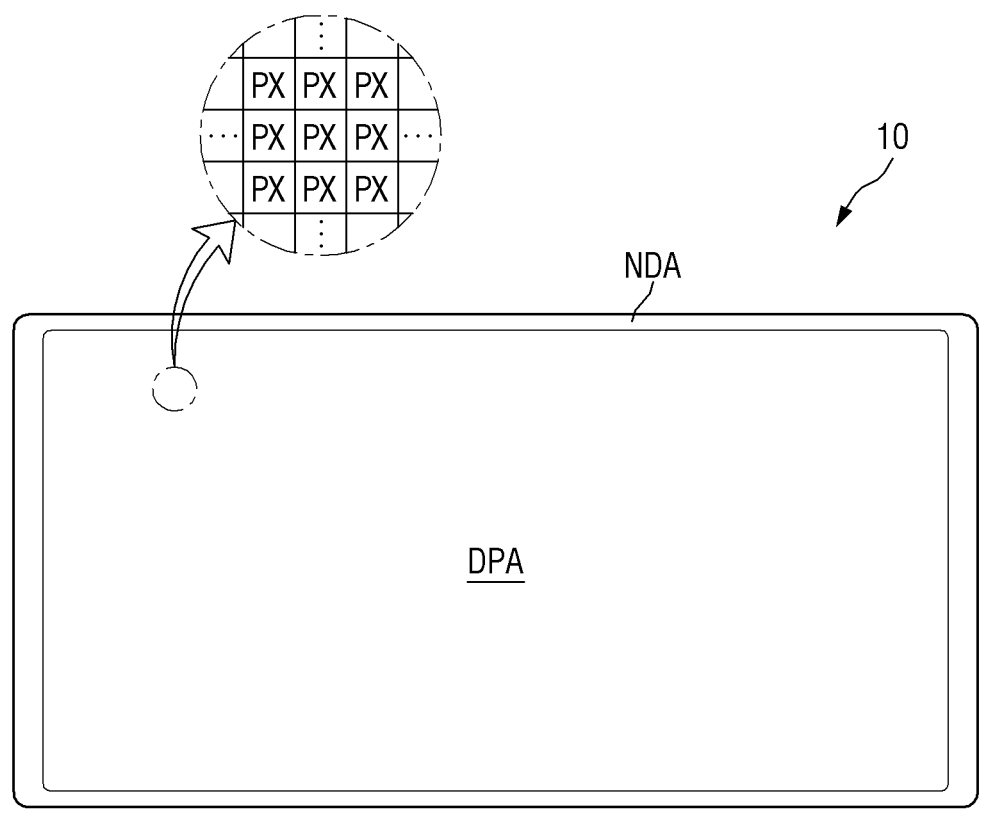
FIG. 1 is a plan view of a display device according to an embodiment.

FIG. 1 is a plan view of a display device 10 according to an embodiment.

Referring to FIG. 1, the display device 10 displays moving images or still images. The display device 10 may refer to any suitable electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel include inorganic light emitting diode (LED) display panels, organic light emitting display panels, quantum dot light emitting display panels, plasma display panels, and field emission display panels. A case where an inorganic LED display panel is applied as an example of the display panel will be described below, but the present disclosure is not limited to this case, and other display panels can also be applied as long as the same technical spirit is applicable.

The shape of the display device 10 can be variously modified. For example, the display device 10 may have various suitable shapes such as a horizontally long rectangle, a vertically long rectangle, a square, a quadrilateral with rounded corners (vertices), other polygons, or a circle. The shape of a display area DPA of the display device 10 may also be similar to the overall shape of the display device 10. In FIG. 1, each of the display device 10 and the display area DPA is shaped like a horizontally long rectangle, but the present disclosure is not limited thereto.

The display device 10 may include the display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DA may generally occupy a center (e.g., approximately a center) of the display device 10.

The display area DA may include a plurality of pixels PX. The pixels PX may be arranged in a matrix direction. Each of the pixels PX may be rectangular or square in a plan view. However, the present disclosure is not limited thereto, and each of the pixels PX may also have a rhombic planar shape having each side inclined with respect to a direction. The pixels PX may be alternately arranged in a stripe or pentile type. In addition, each of the pixels PX may include one or more light emitting elements 30 which emit light of a set or specific wavelength band to display a set or specific color.

The non-display area NDA may be located around the display area DPA. The non-display area NDA may entirely or partially surround the display area DPA. The display area DPA may be rectangular, and the non-display area NDA may be adjacent to four sides of the display area DPA. The non-display area NDA may form a bezel of the display device 10. Wirings or circuit drivers included in the display device 10 may be located, and/or external devices may be mounted, in each non-display area NDA.

Figure 2:
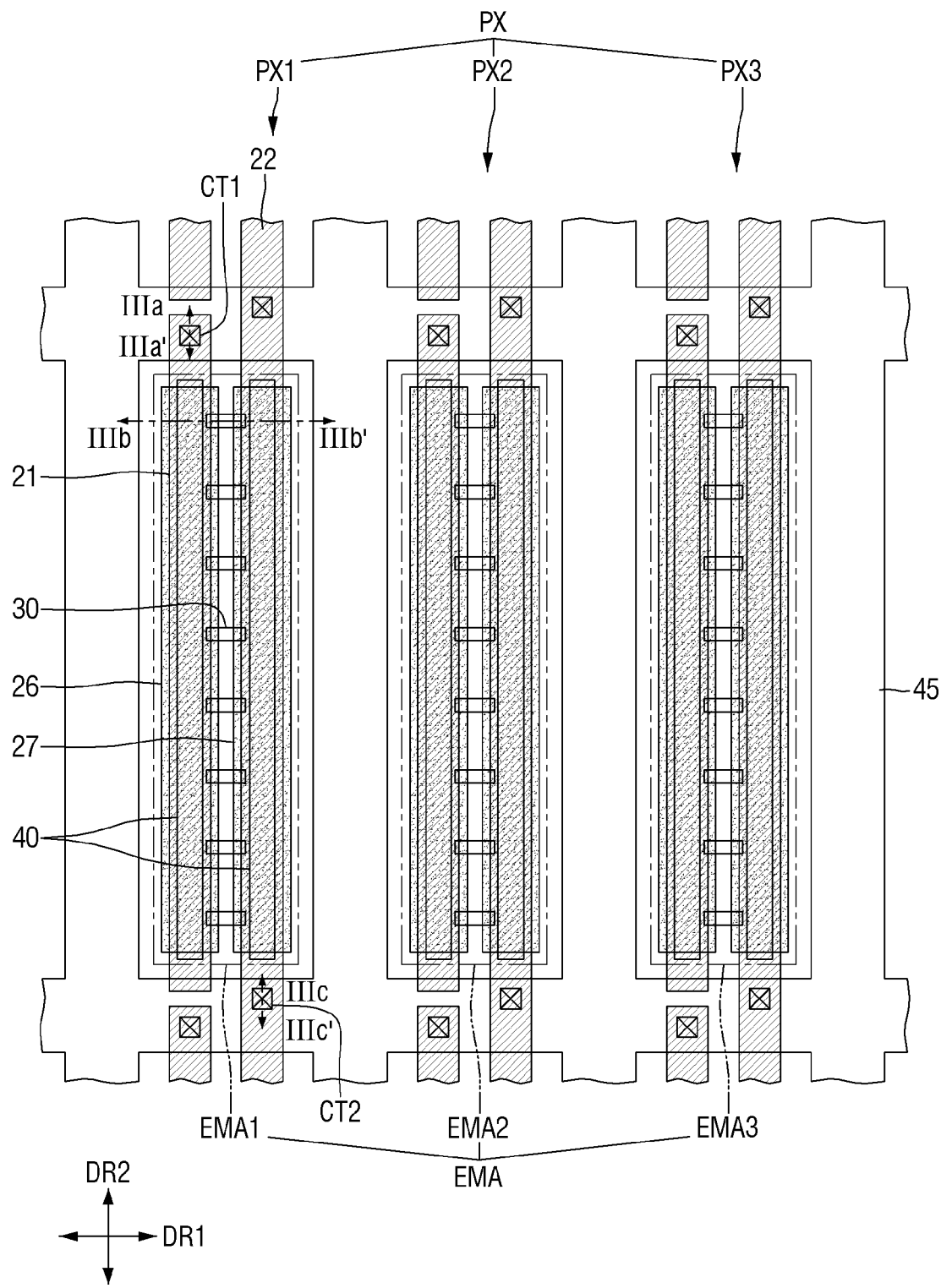
FIG. 2 is a plan view of a pixel of the display device according to the embodiment.

FIG. 2 is a plan view of a pixel PX of the display device 10 according to the embodiment.

Referring to FIG. 2, each of the pixels PX may include a plurality of subpixels PXn (where n is an integer of 1 to 3). For example, one pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. The first color may be blue, the second color may be green, and the third color may be red. However, the present disclosure is not limited thereto, and the subpixels PXn may also emit light of the same color. In addition, although one pixel PX includes three subpixels PXn in FIG. 2, the present disclosure is not limited thereto, and the pixel PX may also include additional subpixels PXn.

Each subpixel PXn of the display device 10 may include an area defined as an emission area EMA. The first subpixel PX1 may include a first emission area EMA1, the second subpixel PX2 may include a second emission area EMA2, and the third subpixel PX3 may include a third emission area EMA3. The emission area EMA may be defined as an area where light emitting elements 30 included in the display device 10 are located to output light of a set or specific wavelength band. Each of the light emitting elements 30 may include an active layer 36 (see FIG. 4), and the active layer 36 may emit light of a set or specific wavelength band in any suitable direction. Light emitted from the active layer 36 of each light emitting element 30 may be radiated toward both sides of the light emitting element 30. The emission area EMA may include an area where the light emitting elements 30 are located and where light emitted from the light emitting elements 30 is output to an area adjacent to the light emitting elements 30.

However, the present disclosure is not limited thereto, and the emission area EMA may also include an area where light emitted from the light emitting elements 30 is output after being reflected or refracted by other members. A plurality of light emitting elements 30 may be in each subpixel PXn, and an area where the light emitting elements 30 are located and an area adjacent to this area may form the emission area EMA.

In some embodiments, each subpixel PXn of the display device 10 may include a non-emission area defined as an area other than the emission area EMA. The non-emission area may be an area in which the light emitting elements 30 are not located and from which no (or substantially no) light is emitted because light emitted from the light emitting elements 30 is not directed to this area.

Figure 3:
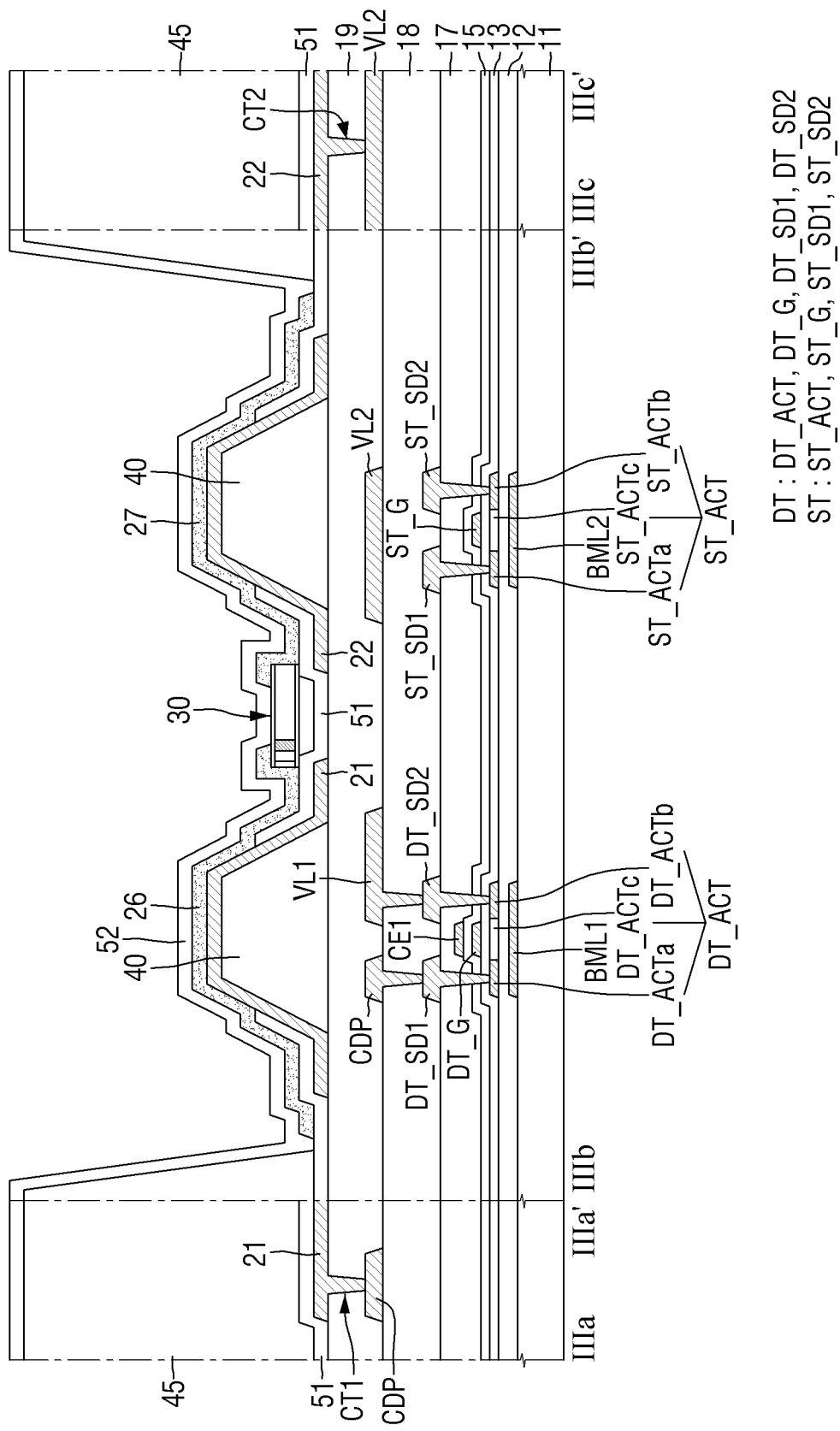
FIG. 3 is a cross-sectional view taken along lines IIIa-IIIa', IIIb-IIIb', and IIIc-IIIc' of FIG. 2.

FIG. 3 is a cross-sectional view taken along lines IIIa-IIIa', IIIb-IIIb', and IIIc-IIIc' of FIG. 2. FIG. 3 illustrates a cross section of only the first subpixel PX1 of FIG. 2, but the same illustration may apply to other pixels PX or subpixels PXn. FIG. 3 illustrates a cross section across an end and the other end portion of a light emitting element 30 in the first subpixel PX1.

Referring to FIG. 3 in connection with FIG. 2, the display device 10 may include a first substrate 11 and a circuit element layer and a display element layer on the first substrate 11. A semiconductor layer, a plurality of conductive layers, and a plurality of insulating layers may be on the first substrate 11 and may constitute the circuit element layer and the display element layer. The conductive layers may include a first gate conductive layer, a second gate conductive layer, a first data conductive layer, a second data conductive layer, electrodes 21 and 22, and contact electrodes 26 and 27. The insulating layers may include a buffer layer 12, a first gate insulating layer 13, a first protective layer 15, a first interlayer insulating layer 17, a second interlayer insulating layer 18, a first planarization layer 19, a first insulating layer 51, and a second insulating layer 52.

In some embodiments, the first substrate 11 may be an insulating substrate. The first substrate 11 may be made of an insulating material such as glass, quartz, and/or polymer resin. In addition, the first substrate 11 may be a rigid substrate, but may also be a flexible substrate that can be bent, folded, and/or rolled.

Light blocking layers may be on the first substrate 11. The light blocking layers may include a first light blocking layer BML1 and a second light blocking layer BML2. The first light blocking layer BML1 and the second light blocking layer BML2 are overlapped by at least a first active material layer DT_ACT of a driving transistor DT and a second active material layer ST_ACT of a switching transistor ST, respectively. The light blocking layers BML1 and BML2 may include a light blocking material to prevent or reduce incidence of light to the first and second active material layers DT_ACT and ST_ACT. For example, the first and second light blocking layers BML1 and BML2 may be made of an opaque metal material that blocks or reduces transmission of light. However, the present disclosure is not limited thereto. In some cases, the light blocking layers BML1 and BML2 may be omitted.

The buffer layer 12 may be on the entire surface of the first substrate 11 having the light blocking layers BML1 and BML2. The buffer layer 12 may be formed on the first substrate 11 to protect the transistors DT and ST of each pixel PX from moisture introduced through the first substrate 11 which is vulnerable to moisture penetration and may perform a surface planarization function. The buffer layer 12 may be composed of a plurality of inorganic layers stacked alternately. For example, the buffer layer 12 may be a multilayer in which inorganic layers including at least any one selected from silicon oxide (SiOx), silicon nitride (SiNx), and silicon oxynitride (SiON) are alternately stacked.

The semiconductor layer is on the buffer layer 12. The semiconductor layer may include the first active material layer DT_ACT of the driving transistor DT and the second active material layer ST_ACT of the switching transistor ST. The first and second active material layers DT_ACT and ST_ACT may be partially overlapped by gate electrodes DT_G and ST_G of the first gate conductive layer which will be further described herein below.

In an exemplary embodiment, the semiconductor layer may include polycrystalline silicon, monocrystalline silicon, an oxide semiconductor, and/or the like. The polycrystalline silicon may be formed by crystalizing amorphous silicon. When the semiconductor layer includes polycrystalline silicon, the first active material layer DT_ACT may include a first doping region DT_ACTa, a second doping region DT_ACTb, and a first channel region DT_ACTc. The first channel region DT_ACTc may be between the first doping region DT_ACTa and the second doping region DT_ACTb. The second active material layer ST_ACT may include a third doping region ST_ACTa, a fourth doping region ST_ACTb, and a second channel region ST_ACTc. The second channel region ST_ACTc may be between the third doping region ST_ACTa and the fourth doping region ST_ACTb. The first doping region DT_ACTa, the second doping region DT_ACTb, the third doping region ST_ACTa, and the fourth doping region ST_ACTb may be regions of the first active material layer DT_ACT and the second active material layer ST_ACT which are doped with impurities.

In an exemplary embodiment, the first active material layer DT_ACT and the second active material layer ST_ACT may include an oxide semiconductor. In this case, the doping regions of the first active material layer DT_ACT and the second active material layer ST_ACT may be conducting regions. The oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-tin oxide (IGTO), and/or indium-gallium-zinc-tin oxide (IGZTO). However, the present disclosure is not limited thereto.

The first gate insulating layer 13 is on the semiconductor layer and the buffer layer 12. The first gate insulating layer 13 may be on the buffer layer 12 having the semiconductor layer. The first gate insulating layer 13 may function as a gate insulating film of each of the driving transistor DT and the switching transistor ST. The first gate insulating layer 13 may be an inorganic layer including an inorganic material such as silicon oxide (SiOx), silicon nitride (SiNx), and/or silicon oxynitride (SiON), or may have a structure in which any of the above materials are stacked.

The first gate conductive layer is on the first gate insulating layer 13. The first gate conductive layer may include a first gate electrode DT_G of the driving transistor DT and a second gate electrode ST_G of the switching transistor ST. The first gate electrode DT_G may overlap the first channel region DT_ACTc of the first active material layer DT_ACT in a thickness direction, and the second gate electrode ST_G may overlap the second channel region ST_ACTc of the second active material layer ST_ACT in the thickness direction.

The first gate conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The first protective layer 15 is on the first gate conductive layer. The first protective layer 15 may cover the first gate conductive layer to protect the first gate conductive layer. The first protective layer 15 may be an inorganic layer including an inorganic material such as silicon oxide (SiOx), silicon nitride (SiNx), and/or silicon oxynitride (SiON), or may have a structure in which any of the above materials are stacked.

The second gate conductive layer is on the first protective layer 15. The second gate conductive layer may include a first capacitive electrode CE1 of a storage capacitor, at least a portion of which overlaps the first gate electrode DT_G in the thickness direction. The first capacitive electrode CE1 may overlap the first gate electrode DT_G in the thickness direction with the first protective layer 15 interposed between them, and the storage capacitor may be formed between the first capacitive electrode CE1 and the first gate electrode DT_G. The second gate conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The first interlayer insulating layer 17 is on the second gate conductive layer. The first interlayer insulating layer 17 may function as an insulating film between the second gate conductive layer and other layers on the second gate conductive layer. The first interlayer insulating layer 17 may be an inorganic layer including an inorganic material such as silicon oxide (SiOx), silicon nitride (SiNx), and/or silicon oxynitride (SiON), or may have a structure in which any of the above materials are stacked.

The first data conductive layer is on the first interlayer insulating layer 17. The first data conductive layer may include a first source/drain electrode DT_SD1 and a second source/drain electrode DT_SD2 of the driving transistor DT and a first source/drain electrode ST_SD1 and a second source/drain electrode ST_SD2 of the switching transistor ST.

The first source/drain electrode DT_SD1 and the second source/drain electrode DT_SD2 of the driving transistor DT may respectively contact the first doping region DT_ACTa and the second doping region DT_ACTb of the first active material layer DT_ACT through contact holes penetrating the first interlayer insulating layer 17 and the first gate insulating layer 103. The first source/drain electrode ST_SD1 and the second source/drain electrode ST_SD2 of the switching transistor ST may respectively contact the third doping region ST_ACTa and the fourth doping region ST_ACTb of the second active material layer ST_ACT through contact holes penetrating the first interlayer insulating layer 17 and the first gate insulating layer 13. In addition, the first source/drain electrode DT_SD1 of the driving transistor DT and the first source/drain electrode ST_SD1 of the switching transistor ST may be electrically coupled to the first light blocking layer BML1 and the second light blocking layer BML2 through other contact holes, respectively. When any one of the first source/drain electrode DT_SD1 or ST_SD1 and the second source/drain electrode DT_SD2 or ST_SD2 of each of the driving transistor DT and the switching transistor ST is a source electrode, the other electrode may be a drain electrode. However, the present disclosure is not limited thereto, and when any one of the first source/drain electrode DT_SD1 or ST_SD1 and the second source/drain electrode DT_SD2 or ST_SD2 is a drain electrode, the other electrode may be a source electrode.

The first data conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The second interlayer insulating layer 18 may be on the first data conductive layer. The second interlayer insulating layer 18 may be on the entire surface of the first interlayer insulating layer 17 to cover the first data conductive layer and protect the first data conductive layer. The second interlayer insulating layer 18 may be an inorganic layer including an inorganic material such as silicon oxide (SiOx), silicon nitride (SiNx), and/or silicon oxynitride (SiON), or may have a structure in which any of the above materials are stacked.

The second data conductive layer is on the second interlayer insulating layer 18. The second data conductive layer may include a first voltage wiring VL1, a second voltage wiring VL2, and a first conductive pattern CDP. A high-potential voltage (or a first power supply voltage VDD) supplied to the driving transistor DT may be applied to the first voltage wiring VL1, and a low-potential voltage (or a second power supply voltage VSS) supplied to a second electrode 22 may be applied to the second voltage wiring VL2. In addition, an alignment signal needed to align the light emitting elements 30 may be transmitted to the second voltage wiring VL2 during a fabrication process of the display device 10.

The first conductive pattern CDP may be electrically coupled to the first source/drain electrode DT_SD1 of the driving transistor DT through a contact hole formed in the second interlayer insulating layer 18. The first conductive pattern CDP may also contact a first electrode 21 that is further described herein below, and the driving transistor DT may transfer the first power supply voltage VDD received from the first voltage wiring VL1 to the first electrode 21 through the first conductive pattern CDP. Although the second data conductive layer includes one second voltage wiring VL2 and one first voltage wiring VL1 in the drawings, the present disclosure is not limited thereto. The second data conductive layer may also include more first voltage wirings VL1 and more second voltage wirings VL2.

The second data conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The first planarization layer 19 is on the second data conductive layer. The first planarization layer 19 may include an organic insulating material such as, for example, polyimide (PI) and perform a surface planarization function.

A plurality of first banks 40, a plurality of electrodes 21 and 22, the light emitting elements 30, a second bank 45, and a plurality of contact electrodes 26 and 27 are on the first planarization layer 19. In addition, a plurality of insulating layers 51 and 52 may be further on the first planarization layer 19.

The first banks 40 may be directly on the first planarization layer 19. The first banks 40 may extend in a second direction DR2 in each subpixel PXn but may end at a position spaced apart from a boundary between the subpixels PXn so as not to extend to another subpixel PXn neighboring in the second direction DR2. In addition, the first banks 40 may be spaced apart to face each other in a first direction DR1. The first banks 40 may be spaced apart from each other to form an area in which the light emitting elements 30 are between the first banks 40. The first banks 40 may be in each subpixel PXn to form linear patterns in the display area DPA of the display device 10. Although two first banks 40 are in FIG. 3, the present disclosure is not limited thereto. The number of the first banks 40 may be increased depending on the number of the electrodes 21 and 22 further described herein below.

At least a portion of each of the first banks 40 may protrude from an upper surface of the first planarization layer 19. The protruding part of each of the first banks 40 may have inclined side surfaces, and light emitted from the light emitting elements 30 may travel toward the inclined side surfaces of the first banks 40. The electrodes 21 and 22 on the first banks 40 may include a material having reflectivity, and light emitted from the light emitting elements 30 may be reflected by the electrodes 21 and 22 on the side surfaces of the first banks 40 to travel toward above the first planarization layer 19. For example, the first banks 40 may provide an area where the light emitting elements 30 are located while functioning as reflective barriers that reflect light emitted from the light emitting elements 30 in an upward direction. The side surfaces of the first banks 40 may be inclined in a linear shape. However, the present disclosure is not limited thereto, and outer surfaces of the first banks 40 may have a curved semi-circular or semi-elliptical shape. In an exemplary embodiment, the first banks 40 may include an organic insulating material such as, for example, polyimide (PI), but the present disclosure is not limited thereto.

The electrodes 21 and 22 are on the first banks 40 and the first planarization layer 19. The electrodes 21 and 22 may include the first electrode 21 and the second electrode 22. The first electrode 21 and the second electrode 22 may extend in the second direction DR2 and may be spaced apart to face each other in the first direction DR1. The first electrode 21 and the second electrode 22 may be shaped substantially similarly to the first banks 40 but their lengths measured in the second direction DR2 may be greater than those of the first banks 40.

The first electrode 21 may extend in the second direction DR2 in each subpixel PXn, but may be spaced apart from another first electrode 21 at a boundary with another subpixel PXn. In some embodiments, the second bank 45 may be at the boundary of each subpixel PXn, and the first electrodes 21 in subpixels PXn neighboring each other in the second direction DR2 may be spaced apart from each other in a part overlapping the second bank 45. The first electrode 21 may be electrically coupled to the driving transistor DT through a first contact hole CT1 at a boundary with each subpixel PXn neighing in the second direction DR2. For example, the first electrode 21 may have at least a part overlapping a portion of the second bank 45 which extends in the first direction DR1 and may contact the first conductive pattern CDP through the first contact hole CT1 penetrating the first planarization layer 19. The first electrode 21 may be electrically coupled to the first source/drain electrode DT_SD1 of the driving transistor DT through the first conductive pattern CDP.

The second electrode 22 may extend in the second direction DR2 beyond the boundary of each subpixel PXn neighboring in the second direction DR2. In some embodiments, one second electrode 22 may be over a plurality of subpixels PXn neighboring each other in the second direction DR2. The second electrode 22 may partially overlap the second bank 45 at the boundary with each subpixel PXn neighboring in the second direction DR2 and may be electrically coupled to the second voltage wiring VL2 through a second contact hole CT2. For example, the second electrode 22 may overlap a portion of the second bank 45 which extends in the first direction DR1 and may contact the second voltage wiring VL2 through the second contact hole CT2 penetrating the first planarization layer 19. The second power supply voltage may be applied to the second electrode 22 through the second voltage wiring VL2. Although the second electrode 22 is electrically coupled to the second voltage wiring VL2 through the second contact hole CT2 at the boundary of each subpixel PXn, the present disclosure is not limited thereto. In some embodiments, one second contact hole CT2 may be provided for every plurality of subpixels PXn.

Although one first electrode 21 and one second electrode 22 are in each subpixel PXn in the drawings, the present disclosure is not limited thereto. In some embodiments, more first electrodes 21 and more second electrodes 22 may be in each subpixel PXn. In addition, the first electrode 21 and the second electrode 22 in each subpixel PXn may not necessarily extend in one direction and may be included in various suitable structures. For example, the first electrode 21 and the second electrode 22 may be partially curved or bent, or any one selected from the first electrode 21 and the second electrode 22 may surround the other electrode. The structure or shape in which the first electrode 21 and the second electrode 22 are provided is not particularly limited as long as the first electrode 21 and the second electrode 22 are at least partially spaced apart to face each other so that an area where the light emitting elements 30 are to be located can be formed between the first electrode 21 and the second electrode 22.

The electrodes 21 and 22 may be electrically coupled to the light emitting elements 30, and a set or predetermined voltage may be applied to the electrodes 21 and 22 so that the light emitting elements 30 can emit light. For example, the electrodes 21 and 22 may be electrically coupled to the light emitting elements 30 through the contact electrodes 26 and 27 to be further described herein below and may transmit received electrical signals to the light emitting elements 30 through the contact electrodes 26 and 27.

In an exemplary embodiment, the first electrode 21 may be separated for each subpixel PXn, and the second electrode 22 may be coupled along the subpixels PXn. However, the present disclosure is not limited thereto, and both the first electrode 21 and the second electrode 22 may also be separated for each subpixel PXn or coupled along the subpixels PXn. In addition, any one selected from the first electrode 21 and the second electrode 22 may be electrically coupled to anodes of the light emitting elements 30, and the other may be electrically coupled to cathodes of the light emitting elements 30. However, the present disclosure is not limited thereto, and the opposite case may also be true.

In addition, each of the electrodes 21 and 22 may be utilized to form an electric field in each subpixel PXn so as to align the light emitting elements 30. The light emitting elements 30 may be arranged between the first electrode 21 and the second electrode 22 by the electric field formed on the first electrode 21 and the second electrode 22. As will be further described herein below, the light emitting elements 30 dispersed in ink may be sprayed onto the first electrode 21 and the second electrode 22 through an inkjet process and may be aligned between the first electrode 21 and the second electrode 22 by transmitting an alignment signal between the first electrode 21 and the second electrode 22 to apply a dielectrophoretic force to the light emitting elements 30.

As illustrated in FIG. 3, according to an embodiment, the first electrode 21 and the second electrode 22 may be on the first banks 40, respectively. The first electrode 21 and the second electrode 22 may be spaced apart to face each other in the first direction DR1, and the light emitting elements 30 may be between the first electrode 21 and the second electrode 22. At least one end portion of each of the light emitting elements 30 between the first electrode 21 and the second electrode 22 may be electrically coupled to the first electrode 21 and the second electrode 22.

In some embodiments, the first electrode 21 and the second electrode 22 may be formed to have greater widths than the first banks 40, respectively. For example, the first electrode 21 and the second electrode 22 may cover the outer surfaces of the first banks 40, respectively. The first electrode 21 and the second electrode 22 may be on the side surfaces of the first banks 40, respectively, and a gap between the first electrode 21 and the second electrode 22 may be smaller than a gap between the first banks 40. In addition, at least a portion of each of the first electrode 21 and the second electrode 22 may be directly on the first planarization layer 19.

Each of the electrodes 21 and 22 may include a transparent conductive material. For example, each of the electrodes 21 and 22 may include a material such as indium-tin oxide (ITO), indium-zinc oxide (IZO), and/or indium-tin-zinc oxide (ITZO), but the present disclosure is not limited thereto. In some embodiments, each of the electrodes 21 and 22 may include a conductive material having high reflectivity. For example, each of the electrodes 21 and 22 may include a metal such as silver (Ag), copper (Cu), and/or aluminum (Al) as a material having high reflectivity. In this case, each of the electrodes 21 and 22 may reflect light, which travels toward the side surfaces of the first banks 40 after being emitted from the light emitting elements 30, toward above each subpixel PXn.

However, the present disclosure is not limited thereto, and each of the electrodes 21 and 22 may also have a structure in which a transparent conductive material and a metal layer having high reflectivity are each stacked in one or more layers or may be formed as a single layer including the transparent conductive material and the metal. In an exemplary embodiment, each of the electrodes 21 and 22 may have a stacked structure of ITO/Ag/ITO, ITO/Ag/IZO, or ITO/Ag/ITZO/IZO, or may be an alloy containing aluminum (Al), nickel (Ni), and/or lanthanum (La).

The first insulating layer 51 is on the first planarization layer 19, the first electrode 21, and the second electrode 22. The first insulating layer 51 is located to cover an area between the first electrode 21 and the second electrode 22 and partially cover the first electrode 21 and the second electrode 22. For example, the first insulating layer 51 may cover most of an upper surface of each of the first electrode 21 and the second electrode 22 but may expose a portion of each of the first electrode 21 and the second electrode 22. The first insulating layer 51 may partially expose the upper surface of each of the first electrode 21 and the second electrode 22, for example, may partially expose a portion of each of the first electrode 21 and the second electrode 22 which is on the first bank 40. The first insulating layer 51 may be formed on substantially the entire surface of the first planarization layer 19 but may include openings partially exposing the first electrode 21 and the second electrode 22.

In an exemplary embodiment, the first insulating layer 51 may be stepped such that a portion of an upper surface of the first insulating layer 51 is recessed between the first electrode 21 and the second electrode 22. In some embodiments, the first insulating layer 51 may include an inorganic insulating material, and a portion of the upper surface of the first insulating layer 51 covering the first electrode 21 and the second electrode 22 may be recessed due to a step formed by the members under the first insulating layer 51. The light emitting elements 30 on the first insulating layer 51 between the first electrode 21 and the second electrode 22 may form an empty space with the recessed upper surface of the first insulating layer 51. The light emitting elements 30 may be partially spaced apart from the upper surface of the first insulating layer 51, and the empty space may be filled with a material that forms the contact electrodes 26 and 27 to be further described herein below. However, the present disclosure is not limited thereto. The first insulating layer 51 may also form a flat upper surface so that the light emitting elements 30 can be on the flat upper surface.

The first insulating layer 51 may protect the first electrode 21 and the second electrode 22 while insulating them from each other. In addition, the first insulating layer 51 may prevent or reduce direct contact of the light emitting elements 30 on the first insulating layer 51 with other members, and thus, prevent or reduce damage to the light emitting elements 30 on the first insulating layer 51. However, the shape and structure of the first insulating layer 51 are not limited to the above example.

The second bank 45 may be on the first insulating layer 51. In some embodiments, the second bank 45 on the first insulating layer 51 may surround an area where the light emitting elements 30 are located as well as an area where the first banks 40 are located and may be at each boundary between the subpixels PXn. The second bank 45 may extend in the first direction DR1 and the second direction DR2 to form a lattice pattern over the entire display area DPA. A portion of the second bank 45 which extends in the first direction DR1 may partially overlap the first electrode 21 and the second electrode 22, but a part extending in the second direction DR2 may be spaced apart from the first banks 40 and the first and second electrodes 21 and 22.

According to an embodiment, a height of the second bank 45 may be greater than a height of each of the first banks 40. Unlike the first banks 40, the second bank 45 may separate neighboring subpixels PXn while preventing or reducing overflow of ink to adjacent subpixels PXn in an inkjet printing process for placing the light emitting elements 30 during the fabrication process of the display device 10, which is described in more detail herein below. The second bank 45 may separate inks in which different light emitting elements 30 are dispersed for different subpixels PXn so as to prevent or reduce mixing of the inks with each other. Like the first banks 40, the second bank 45 may include polyimide (PI), but the present disclosure is not limited thereto.

The light emitting elements 30 may be between the electrodes 21 and 22. In an exemplary embodiment, the light emitting elements 30 may extend in one direction and may be spaced apart from each other and aligned substantially parallel to each other. A gap between the light emitting elements 30 is not particularly limited. In some cases, a plurality of light emitting elements 30 may be adjacent to each other to form a cluster, and a plurality of other light emitting elements 30 may be located (or spaced apart) at regular intervals to form a cluster or may be located with uneven density (e.g., may be spaced apart at uneven or irregular intervals). In addition, the direction in which the electrodes 21 and 22 extend and the direction in which the light emitting elements 30 extend may be substantially perpendicular to each other. However, the present disclosure is not limited thereto, and the light emitting elements 30 may also extend in a direction not perpendicular but oblique to the direction in which the electrodes 21 and 22 extend.

The light emitting elements 30 according to an embodiment may include active layers 36 (see FIG. 4) including different materials to emit light of different wavelength bands. The display device 10 according to the embodiment may include the light emitting elements 30 which emit light of different wavelength bands. For example, each light emitting element 30 of the first subpixel PX1 may include an active layer 36 that emits light of the first color whose central wavelength band is a first wavelength, each light emitting element 30 of the second subpixel PX2 may include an active layer 36 that emits light of the second color whose central wavelength band is a second wavelength, and each light emitting element 30 of the third subpixel PX3 may include an active layer 36 that emits light of the third color whose central wavelength band is a third wavelength.

Accordingly, the light of the first color, the light of the second color, and the light of the third color may be output from the first subpixel PX1, the second subpixel PX2, and the third subpixel PX3, respectively. In some embodiments, the light of the first color may be blue light whose central wavelength band is in a range of 450 nm to 495 nm, the light of the second color may be green light whose central wavelength band is in a range of 495 nm to 570 nm, and the light of the third color may be red light whose central wavelength band is in a range of 620 nm to 752 nm. However, the present disclosure is not limited thereto. In some cases, the first subpixel PX1, the second subpixel PX2, and the third subpixel PX3 may include the light emitting elements 30 of the same type (or kind) to emit light of substantially the same color.

The light emitting elements 30 may be on the first insulating layer 51 between the first banks 40 or between the electrodes 21 and 22. For example, at least one end portion of each light emitting element 30 may be on the first electrode 21 or the second electrode 22. As illustrated in the drawings, a length by which the light emitting elements 30 extend may be greater than the gap between the first electrode 21 and the second electrode 22, and both ends of each light emitting element 30 may be on the first electrode 21 and the second electrode 22, respectively. However, the present disclosure is not limited thereto, and only one end portion of each light emitting element 30 may be on the electrode 21 or 22, or both ends of each light emitting element 30 may not be on the electrodes 21 and 22. Even if the light emitting elements 30 are not on the electrodes 21 and 22, both ends of each light emitting element 30 may be electrically coupled to the electrodes 21 and 22 through the contact electrodes 26 and 27, respectively. In some embodiments, at least a portion of each light emitting element 30 may be between the first electrode 21 and the second electrode 22, and both ends of each light emitting element 30 may be electrically coupled to the electrodes 21 and 22.

In some embodiments, at least some of the light emitting elements 30 in each subpixel PXn may be in an area other than the area between the first banks 40, for example, may be on the electrodes 21 and 22 or between each of the first banks 40 and the second bank 45.

Each of the light emitting elements 30 may include a plurality of layers located in a direction perpendicular (e.g., substantially perpendicular) to an upper surface of the first substrate 11 or the first planarization layer 19. According to an embodiment, each of the light emitting elements 30 may extend in a direction and have a structure in which a plurality of semiconductor layers are sequentially located along the direction. The direction in which the light emitting elements 30 of the display device 10 extend may be parallel (e.g., substantially parallel) to the first planarization layer 19, and the semiconductor layers included in each of the light emitting elements 30 may be sequentially located along a direction parallel (e.g., substantially parallel) to the upper surface of the first planarization layer 19. However, the present disclosure is not limited thereto. In some cases, when each of the light emitting elements 30 has a different structure, the layers may be located in a direction perpendicular (e.g., substantially perpendicular) to the first planarization layer 19.

In addition, both ends of each light emitting element 30 may contact the contact electrodes 26 and 27, respectively. According to an embodiment, an insulating film 38 (see FIG. 4) may not be formed on end surfaces of each light emitting element 30 in the direction in which the light emitting elements 30 extend, thereby exposing some of the semiconductor layers. Thus, the exposed semiconductor layers may contact the contact electrodes 26 and 27 to be further described herein below. However, the present disclosure is not limited thereto. In some cases, at least a portion of the insulating film 38 of each light emitting element 30 may be removed to partially expose side surfaces of both ends of the semiconductor layers. The exposed side surfaces of the semiconductor layers may directly contact the contact electrodes 26 and 27.

The contact electrodes 26 and 27 are on the electrodes 21 and 22 and the light emitting elements 30. The contact electrodes 26 and 27 may include a first contact electrode 26 which is on the first electrode 21 and contacts an end portion of each light emitting element 30 and a second contact electrode 27 which is on the second electrode 22 and contacts the other end portion of each light emitting element 30.

The first contact electrode 26 and the second contact electrode 27 may be shaped similarly to the first banks 40. For example, the first contact electrode 26 and the second contact electrode 27 may extend in the second direction DR2 in each subpixel PXn but may be spaced apart to face each other in the first direction DR1. The first contact electrode 26 and the second contact electrode 27 may be spaced apart to face each other in the area where the light emitting elements 30 are, for example, between the first electrode 21 and the second electrode 22. The contact electrodes 26 and 27 are in an area surrounded by the second bank 45 and are spaced apart from the boundary of each neighboring subpixel PXn. In some embodiments, the contact electrodes 26 and 27 may form linear patterns in each subpixel PXn.

The first contact electrode 26 and the second contact electrode 27 may respectively contact the exposed upper surfaces of the first electrode 21 and the second electrode 22 where the first insulating layer 51 is not provided. In addition, the contact electrodes 26 and 27 may respectively contact both ends of each of the light emitting elements 30. In some embodiments, the contact electrodes 26 and 27 may include a conductive material, and the light emitting elements 30 may be electrically coupled to the electrodes 21 and 22 through contact with the contact electrodes 26 and 27. As described above, a plurality of semiconductor layers may be partially exposed at both ends of each of the light emitting elements 30, and the contact electrodes 26 and 27 may directly contact the exposed semiconductor layers. Because the first contact electrode 26 and the second contact electrode 27 extend along the second direction DR2, they may partially cover outer surfaces of the light emitting elements 30 between the electrodes 21 and 22.

In some embodiments, widths of the first contact electrode 26 and the second contact electrode 26 measured in a set direction may be equal to or greater than widths of the first electrode 21 and the second electrode 22 measured in the direction, respectively. The first contact electrode 26 and the second contact electrode 26 may respectively contact an end and the other end portion of each light emitting element 30 and respectively cover both side surfaces of the first electrode 21 and the second electrode 22. As described above, the upper surfaces of the first electrode 21 and the second electrode 22 may be partially exposed, and the first contact electrode 26 and the second contact electrode 27 may respectively contact the exposed upper surfaces of the first electrode 21 and the second electrode 22. For example, the contact electrode 26 and 27 may respectively contact parts of the first electrode 21 and the second electrode 22 which are located on the first banks 40. In addition, as illustrated in FIG. 3, at least a portion of each of the first contact electrode 26 and the second contact electrode 27 may be on the first insulating layer 51. However, the present disclosure is not limited thereto, and in some cases, the first contact electrode 26 and the second contact electrode 27 may have smaller widths than the first electrode 21 and the second electrode 22 to cover only the exposed parts of the upper surfaces of the first electrode 21 and the second electrode 22.

Although one first contact electrode 26 and one second contact electrode 27 are in one subpixel PXn in the drawings, the present disclosure is not limited thereto. The number of the first contact electrodes 26 and the second contact electrodes 27 may vary according to the number of the first electrodes 21 and the second electrodes 22 in each subpixel PXn.

During the fabrication process of the display device 10, after the light emitting elements 30 are on the electrodes 21 and 22, it may be necessary to anchor the placement position of the light emitting elements 30. For example, when a process of forming the contact electrodes 26 and 27 directly on the light emitting elements 30 and the electrodes 21 and 22 is performed, the position of the light emitting elements 30 may be changed in the process of depositing the material of the contact electrodes 26 and 27. By anchoring the placement position and/or alignment position of the light emitting elements 30 before the process of forming the contact electrodes 26 and 27, the electrodes 21 and 22 and the light emitting elements 30 can be smoothly electrically coupled. The contact electrodes 26 and 27 of the display device 10 may have conductive properties and include a material that can anchor to the position of the light emitting elements 30 during the fabrication process of the display device 10.

According to an embodiment, the contact electrodes 26 and 27 may include a transparent conductive polymer. When the contact electrodes 26 and 27 are made of a polymer, they may function to anchor the alignment position of the light emitting elements 30 during the fabrication process of the display device 10. In addition, because the material that forms the contact electrodes 26 and 27 has conductive properties, electrical connection between the light emitting elements 30 and the electrodes 21 and 22 may be possible. Further, because the contact electrodes 26 and 27 include a transparent material, light emitted from the light emitting elements 30 may be output or transmitted to the outside through the contact electrodes 26 and 27.

In some embodiments, the conductive polymer included in the contact electrodes 26 and 27 may be poly(3,4-ethylenedioxythiophene)polystyrene sulfonate (PEDOT:PSS). PEDOT:PSS may have electrical conductivity by including a polymer chain made of PEDOT and charges formed at side chains of PSS. In addition, because PEDOT:PSS may have transparent properties, the contact electrodes 26 and 27 made of PEDOT:PSS may form transparent conductive electrodes having properties similar to those of transparent conductive electrodes including other materials such as ITO. Light emitted from both ends of each light emitting element 30 may pass through the contact electrodes 26 and 27 and then be reflected by the electrodes 21 and 22 on the first banks 40 toward an area above the first substrate 11.

Each of the contact electrodes 26 and 27 may have a set or certain level of thickness. When the contact electrodes 26 and 27 are thin, electrical resistivity may be increased even though transmittance of light is high. On the other hand, if the thicknesses of the contact electrodes 26 and 27 are increased in consideration of electrical resistivity, transmittance of light may be lowered. In an exemplary embodiment, the thicknesses of the contact electrodes 26 and 27 may be in a range of 150 nm to 250 nm or may be about 200 nm. In the above range, the contact electrodes 26 and 27 may have high transmittance of light compared to low electrical resistivity. The thicknesses of the contact electrodes 26 and 27 may be adjusted in a process of curing a conductive polymer solution after coating the conductive polymer solution during the fabrication process of the display device 10 or by laminating a plurality of layers.

According to an embodiment, the contact electrodes 26 and 27 including a conductive polymer may be formed by coating a conductive polymer solution on the light emitting elements 30 and the electrodes 21 and 22 and then curing and etching the conductive polymer solution in the fabrication process of the display device 10. The conductive polymer solution may be cured to form a conductive polymer layer, and a portion of the conductive polymer layer may be etched to form the first contact electrode 26 and the second contact electrode 27. According to an embodiment, a portion of the conductive polymer layer which is located between the first electrode 21 and the second electrode 22 may be etched and removed, and the first contact electrode 26 and the second contact electrode 27 may be spaced apart from each other on the light emitting elements 30. The first contact electrode 26 and the second contact electrode 27 may not be directly coupled to each other but may each be electrically coupled to the first electrode 21 or the second electrode 22 and the light emitting elements 30.

In the fabrication process of the display device 10, the light emitting elements 30 may be anchored using a conductive polymer at the same (e.g., substantially the same) time as when the contact electrodes 26 and 27 electrically coupled to the electrodes 21 and 22, respectively, and the light emitting elements 30 are formed. Therefore, the process of anchoring the light emitting elements 30 and the process of forming the contact electrodes 26 and 27 can be integrated or consolidated. Accordingly, because the process of anchoring the light emitting elements 30 is omitted from the fabrication process of the display device 10, the fabrication process can be shortened. In addition, because the contact electrodes 26 and 27 are formed through an etching process without a member for anchoring the light emitting elements 30, a process margin can be secured more easily.

As described above, the upper surface of the first insulating layer 51 may be partially stepped, and a space may be formed between the upper surface of the first insulating layer 51 and the light emitting elements 30. In some embodiments, the conductive polymer that forms the contact electrodes 26 and 27 may be between lower surfaces of the light emitting elements 30 and the first insulating layer 51. As described above, a conductive polymer solution may be coated on the light emitting elements 30 and the electrodes 21 and 22 in the process of forming the contact electrodes 26 and 27 and may fill the space between the first insulating layer 51 and the light emitting elements 30. Accordingly, a portion of the lower surface of each light emitting element 30 may directly contact the conductive polymer material that forms the contact electrodes 26 and 27. However, the present disclosure is not limited thereto.

The second insulating layer 52 may be on the entire surface of the first substrate 11. The second insulating layer 52 may function to protect members on the first substrate 11 from the external environment. In some embodiments, the second insulating layer 52 may directly contact the light emitting elements 30 overlapping a part between the contact electrodes 26 and 27, in addition to the contact electrodes 26 and 27, the first insulating layer 51 and the second bank 45.

Each of the first insulating layer 51 and the second insulating layer 52 described above may include an inorganic insulating material and/or an organic insulating material. In an exemplary embodiment, each of the first insulating layer 51 and the second insulating layer 52 may include an inorganic insulating material such as silicon oxide (SiOx), silicon nitride (SiNx), silicon oxynitride (SiOxNy), aluminum oxide ($Al_2O_3$), and/or aluminum nitride (AlN). In some embodiments, each of the first insulating layer 51 and the second insulating layer 52 may include an organic insulating material such as, for example, acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, and/or polymethyl methacrylate-polycarbonate synthetic resin. However, the present disclosure is not limited thereto.

Because the display device 10 according to the embodiment includes the contact electrodes 26 and 27 including a conductive polymer, a member for anchoring the light emitting elements 30 can be omitted. In addition, because the fabrication process of the display device 10 includes the process of coating a conductive polymer solution on the light emitting elements 30, the contact electrodes 26 and 27 can be formed in a state where the light emitting elements 30 are anchored. The number of processes required to fabricate the display device 10 can be reduced, and the process margin of the contact electrodes 26 and 27 can be secured easily.

The light emitting elements 30 may be LEDs. For example, each of the light emitting elements 30 may be an inorganic LED having a size in a micrometer or nanometer range and may be made of an inorganic material. When an electric field is formed in a set or specific direction between two electrodes facing each other, the inorganic LEDs may be aligned between the two electrodes in which polarity is formed.

Figure 4:
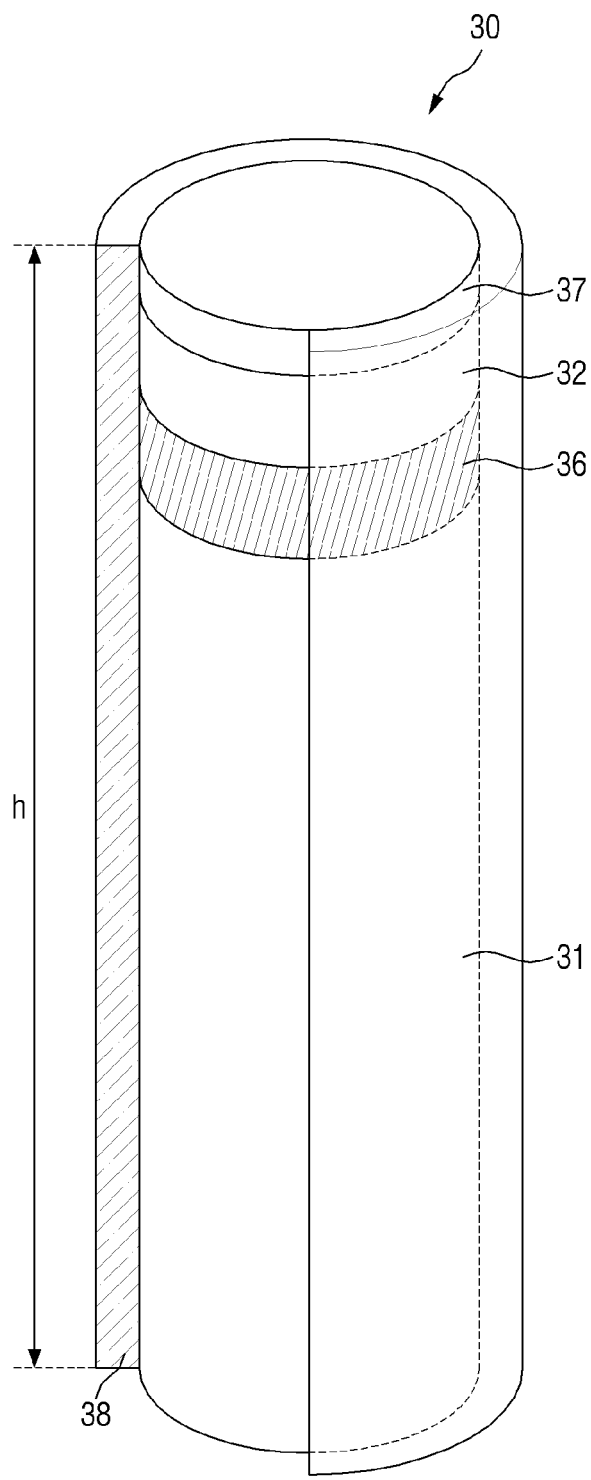
FIG. 4 is a schematic view of a light emitting element according to an embodiment.

FIG. 4 is a schematic view of a light emitting element 30 according to an embodiment.

Referring to FIG. 4, the light emitting element 30 according to the embodiment may extend in one direction. The light emitting element 30 may be shaped like a rod, a wire, a tube, or the like. In an exemplary embodiment, the light emitting element 30 may be shaped like a cylinder or a rod. However, the shape of the light emitting element 30 is not limited thereto, and the light emitting element 30 may also have various suitable shapes including polygonal prisms, such as a cube, a rectangular parallelepiped or a hexagonal prism, and a shape extending in a direction and having a partially inclined outer surface.

The light emitting element 30 may include a semiconductor layer doped with impurities of any conductivity type (e.g., a p-type or an n-type). The semiconductor layer may receive an electrical signal from an external power source and emit light of a set or specific wavelength band. A plurality of semiconductors included in the light emitting element 30 may be sequentially arranged or stacked along the one direction.

The light emitting element 30 may include a first semiconductor layer 31, a second semiconductor layer 32, an active layer 36, an electrode layer 37, and an insulating film 38. To visually show each element of the light emitting element 30, the insulating film 38 is illustrated in the drawing as having been partially removed to expose the semiconductor layers 31, 32 and 36. However, as will be further described herein below, the insulating film 38 may be located to surround outer surfaces of the semiconductor layers 31, 32 and 36.

For example, the first semiconductor layer 31 may be an n-type semiconductor. In an example, if the light emitting element 30 emits light in a blue wavelength band, the first semiconductor layer 31 may include a semiconductor material having a chemical formula of AlxGayIn1-x-yN (0≤x≤1, 0≤y≤1, 0≤x+y≤1). For example, the semiconductor material included in the first semiconductor layer 31 may be any one or more selected from n-type doped AlGaInN, GaN, AlGaN, InGaN, AlN, and InN. The first semiconductor layer 31 may be doped with an n-type dopant, and the n-type dopant may be, for example, Si, Ge, and/or Sn. In an exemplary embodiment, the first semiconductor layer 31 may be n-GaN doped with n-type Si. A length of the first semiconductor layer 31 may be in a range of, but not limited to, 1.5 µm to 5 µm.

The second semiconductor layer 32 is on the active layer 36 to be further described herein below. The second semiconductor layer 32 may be a p-type semiconductor. In an example, if the light emitting element 30 emits light in a blue or green wavelength band, the second semiconductor layer 32 may include a semiconductor material having a chemical formula of AlxGayIn1-x-yN (0≤x≤1, 0≤y≤1, 0≤x+y≤1). For example, the semiconductor material included in the second semiconductor layer 32 may be any one or more selected from p-type doped AlGaInN, GaN, AlGaN, InGaN, AlN, and InN. The second semiconductor layer 32 may be doped with a p-type dopant, and the p-type dopant may be, for example, Mg, Zn, Ca, Se, and/or Ba. In an exemplary embodiment, the second semiconductor layer 32 may be p-GaN doped with p-type Mg. A length of the second semiconductor layer 32 may be in a range of, but not limited to, 0.05 µm to 0.10 µm.

Although each of the first semiconductor layer 31 and the second semiconductor layer 32 is composed of one layer in the drawing, the present disclosure is not limited thereto. According to some embodiments, each of the first semiconductor layer 31 and the second semiconductor layer 32 may include more layers, for example, may further include a clad layer or a tensile strain barrier reducing (TSBR) layer depending on the material of the active layer 36.

The active layer 36 is between the first semiconductor layer 31 and the second semiconductor layer 32. The active layer 36 may include a material having a single or multiple quantum well structure. When the active layer 36 includes a material having a multiple quantum well structure, it may have a structure in which a plurality of quantum layers and a plurality of well layers are alternately stacked. The active layer 36 may emit light through combination of electron-hole pairs according to electrical signals received through the first semiconductor layer 31 and the second semiconductor layer 32. For example, if the active layer 36 emits light in the blue wavelength band, it may include a material such as AlGaN or AlGaInN. In some embodiments, when the active layer 36 has a multiple quantum well structure in which a quantum layer and a well layer are alternately stacked, the quantum layer may include a material such as AlGaN and/or AlGaInN, and the well layer may include a material such as GaN and/or AlInN. In an exemplary embodiment, the active layer 36 may include AlGaInN as a quantum layer and AlInN as a well layer to emit blue light whose central wavelength band is in a range of 450 nm to 495 nm.

However, the present disclosure is not limited thereto, and the active layer 36 may also have a structure in which a semiconductor material having a large band gap energy and a semiconductor material having a small band gap energy are alternately stacked or may include different group 3 to 5 semiconductor materials depending on the wavelength band of light that it emits. Light emitted from the active layer 36 is not limited to light in the blue wavelength band. In some cases, the active layer 36 may emit light in a red or green wavelength band. A length of the active layer 36 may be in a range of, but not limited to, 0.05 µm to 0.10 µm.

Light emitted from the active layer 36 may be radiated not only through an outer surface of the light emitting element 30 in a longitudinal direction, but also through both side surfaces. The direction of light emitted from the active layer 36 is not limited to one direction.

The electrode layer 37 may be an ohmic contact electrode. However, the present disclosure is not limited thereto, and the electrode layer 37 may also be a Schottky contact electrode (e.g., an electrode formed by a junction of a semiconductor and a metal). The light emitting element 30 may include at least one electrode layer 37. Although the light emitting element 30 includes one electrode layer 37 in the drawing, the present disclosure is not limited thereto. In some cases, the light emitting element 30 may include additional electrode layers 37, or the electrode layer 37 may be omitted. The following description of the light emitting element 30 may apply equally even when the light emitting element 30 includes a different number of electrode layers 37 or further includes another structure.

When the light emitting element 30 is electrically coupled to the electrodes 21 and 22 or the contact electrodes 26 and 27 in the display device 10 according to the embodiment, the electrode layer 37 may reduce the resistance between the light emitting element 30 and the electrodes 21 and 22 or the contact electrodes 26 and 27. The electrode layer 37 may include a conductive metal. For example, the electrode layer 37 may include at least any one selected from aluminum (Al), titanium (Ti), indium (In), gold (Au), silver (Ag), indium-tin oxide (ITO), indium-zinc oxide (IZO), and indium-tin-zinc oxide (ITZO). In addition, the electrode layer 37 may include an n-type or p-type doped semiconductor material. The electrode layer 37 may include the same material or different materials. A length of the electrode layer 37 may be in a range of, but not limited to, 0.05 µm to 0.10 µm.

The insulating film 38 surrounds outer surfaces of the semiconductor layers and the electrode layer described above. In an exemplary embodiment, the insulating film 38 may surround an outer surface of at least the active layer 36 and extend in the direction in which the light emitting element 30 extends. The insulating film 38 may protect the above members. For example, the insulating film 38 may surround side surfaces of the above members but may expose both ends of the light emitting element 30 in the longitudinal direction.

In the accompanying drawing, the insulating film 38 extends in the longitudinal direction of the light emitting element 30 to cover from side surfaces of the first semiconductor layer 31 to side surfaces of the electrode layer 37. However, the present disclosure is not limited thereto, and the insulating film 38 may cover outer surfaces of the active layer 36 and only some semiconductor layers or may cover only a portion of an outer surface of the electrode layer 37 to partially expose the outer surface of the electrode layer 37. In addition, an upper surface of the insulating film 38 may be rounded in a cross section in an area adjacent to at least one end portion of the light emitting element 30.

A thickness of the insulating film 38 may be in a range of, but not limited to, 10 nm to 1.0 µm. The thickness of the insulating film 38 may be, for example, about 40 nm.

The insulating film 38 may include an insulating material such as, for example, silicon oxide (SiOx), silicon nitride (SiNx), silicon oxynitride (SiOxNy), aluminum nitride (AlN), and/or aluminum oxide (Al₂O₃). Accordingly, it can prevent or reduce an electrical short circuit that may occur when the active layer 36 directly contacts an electrode that transmits an electrical signal to the light emitting element 30. In addition, because the insulating film 38 protects the outer surface of the light emitting element 30 including the active layer 36, a reduction in luminous efficiency can be prevented or reduced.

In addition, in some embodiments, an outer surface of the insulating film 38 may be treated. When the display device 10 is fabricated, the light emitting element 30 dispersed in a set or predetermined ink may be sprayed onto electrodes and then aligned. Here, the surface of the insulating film 38 may be hydrophobic or hydrophilic-treated so that the light emitting element 30 is kept separate in the ink without being agglomerated with other adjacent light emitting elements 30.

A length h of the light emitting element 30 may be in a range of 1 μm to 10 μm or 2 μm to 6 μm and may be, for example, in a range of 3 μm to 5 μm. In addition, a diameter of the light emitting element 30 may be in a range of 300 nm to 700 nm, and an aspect ratio of the light emitting element 30 may be 1.2 to 100. However, the present disclosure is not limited thereto, and a plurality of light emitting elements 30 included in the display device 10 may also have different diameters according to a difference in composition of the active layer 36. The diameter of the light emitting element 30 may be, for example, about 500 nm.

A method of fabricating the display device 10 according to the embodiment will now be described with reference to FIGS. 5-12.

Figure 5:
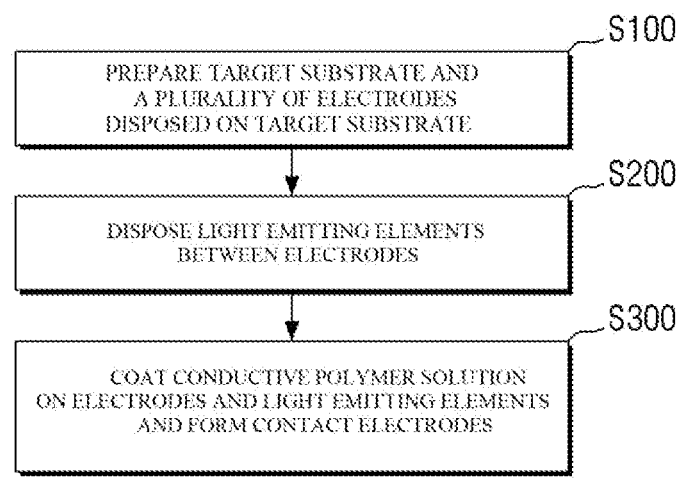
FIG. 5 is a flowchart illustrating a method of fabricating a display device according to an embodiment.

FIG. 5 is a flowchart illustrating a method of fabricating a display device according to an embodiment. FIGS. 6 through 12 are cross-sectional views illustrating a process of fabricating a display device according to an embodiment.

Referring to FIG. 5, the method of fabricating the display device 10 according to the embodiment may include preparing a target substrate SUB and a plurality of electrodes 21 and 22 on the target substrate SUB (operation S100), placing light emitting elements 30 between the electrodes 21 and 22 (operation S200), and coating a conductive polymer solution PS on the electrodes 21 and 22 and the light emitting elements 30 and forming contact electrodes 26 and 27 (operation S300). The forming of the contact electrodes 26 and 27 may include coating the conductive polymer solution PS on the electrodes 21 and 22 and the light emitting elements 30, forming a conductive polymer layer CPL by curing the conductive polymer solution PS, and forming a first contact electrode 26 and a second contact electrode 27 by partially removing the conductive polymer layer CPL.

Figure 6:
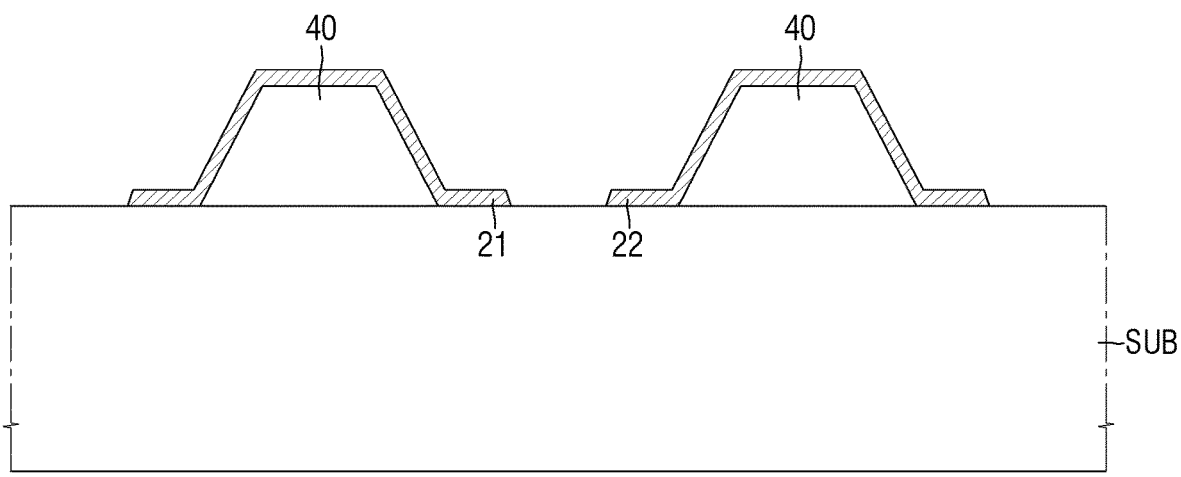
FIGS. 6 through 12 are cross-sectional views illustrating a process of fabricating a display device according to an embodiment.

First, referring to FIG. 6, a target substrate SUB is prepared, and a plurality of electrodes 21 and 22 are formed on the target substrate SUB. The electrodes 21 and 22 may include a first electrode 21 and a second electrode 22 spaced apart to face each other. In addition, on the target substrate SUB, a plurality of first banks 40 may be further between the first electrode 21 and the second electrode 22 and the target substrate SUB. This has been described above. In some embodiments, the target substrate SUB may include a plurality of circuit elements composed of a plurality of conductive layers and a plurality of insulating layers as well as the first substrate 11 described above. For ease of description, the target substrate SUB including these elements will be illustrated and described below.

Figure 7:
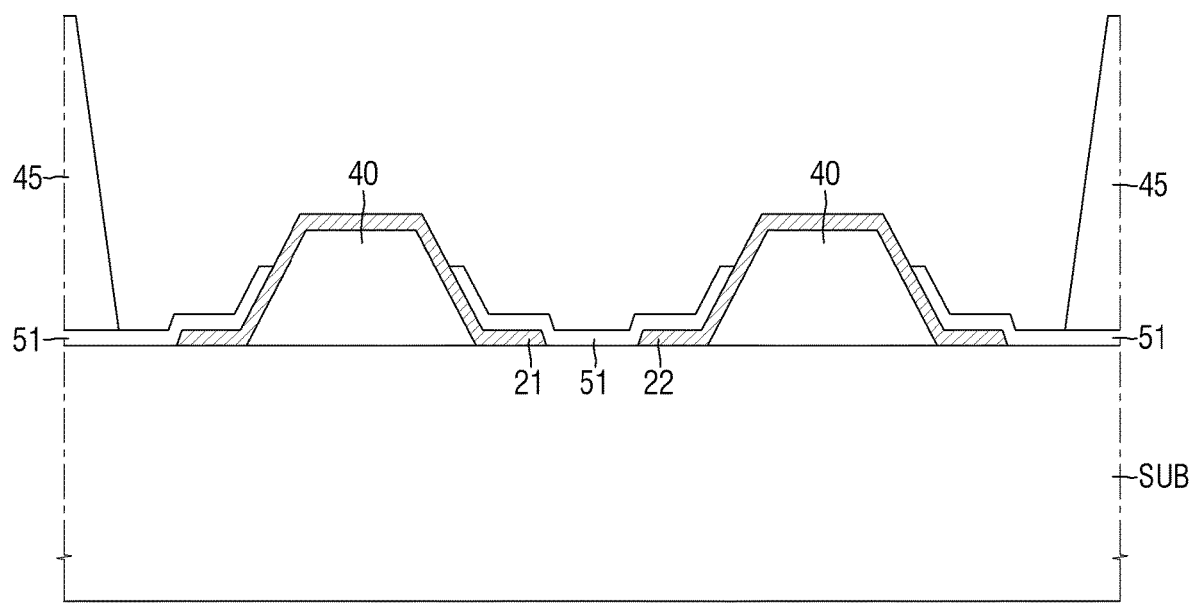

Next, referring to FIG. 7, a first insulating layer 51 is formed to partially cover the first electrode 21 and the second electrode 22. The first insulating layer 51 may be on the entire surface of the target substrate SUB but may partially expose respective upper surfaces of the electrodes 21 and 22. In some embodiments, a process of forming a second bank 45 on the first insulating layer 51 may be further performed.

Figure 8:
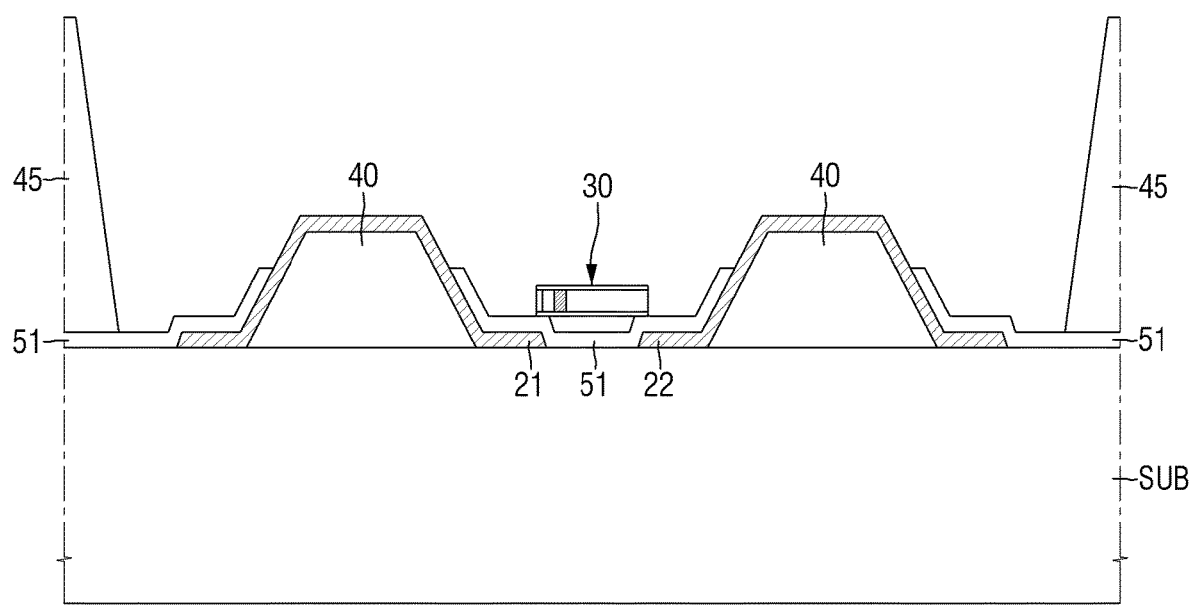

Next, referring to FIG. 8, light emitting elements 30 are placed between the first electrode 21 and the second electrode 22. The light emitting elements 30 may be placed between the electrodes 21 and 22 such that at least one end portion of each of the light emitting elements 30 is on the electrode 21 or 22. In an exemplary embodiment, the light emitting elements 30 dispersed in ink may be prepared and then sprayed onto the target substrate SUB by a printing process using an inkjet printing device. The light emitting elements 30 dispersed in the ink and sprayed onto the electrodes 21 and 22 may be settled between the electrodes 21 and 22 by an alignment signal transmitted to each of the electrodes 21 and 22. For example, when an alignment signal is transmitted to the first electrode 21 and the second electrode 22, an electric field may be formed in the ink sprayed onto the electrodes 21 and 22. When the electric field is formed on the first electrode 21 and the second electrode 22, the light emitting elements 30 dispersed in the ink may receive a dielectrophoretic force due to the electric field. The dielectrophoretic force applied to the light emitting elements 30 may change the orientation direction and position of the light emitting elements 30, thereby settling the light emitting elements 30 between the first electrode 21 and the second electrode 22.

Figure 9:
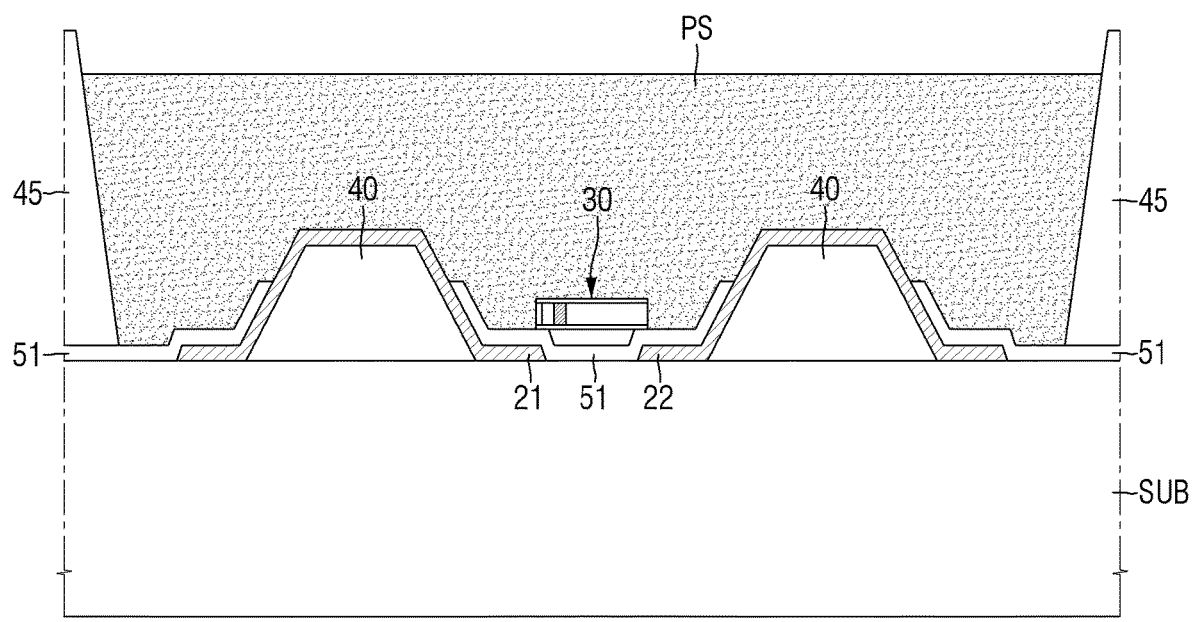
Figure 10:
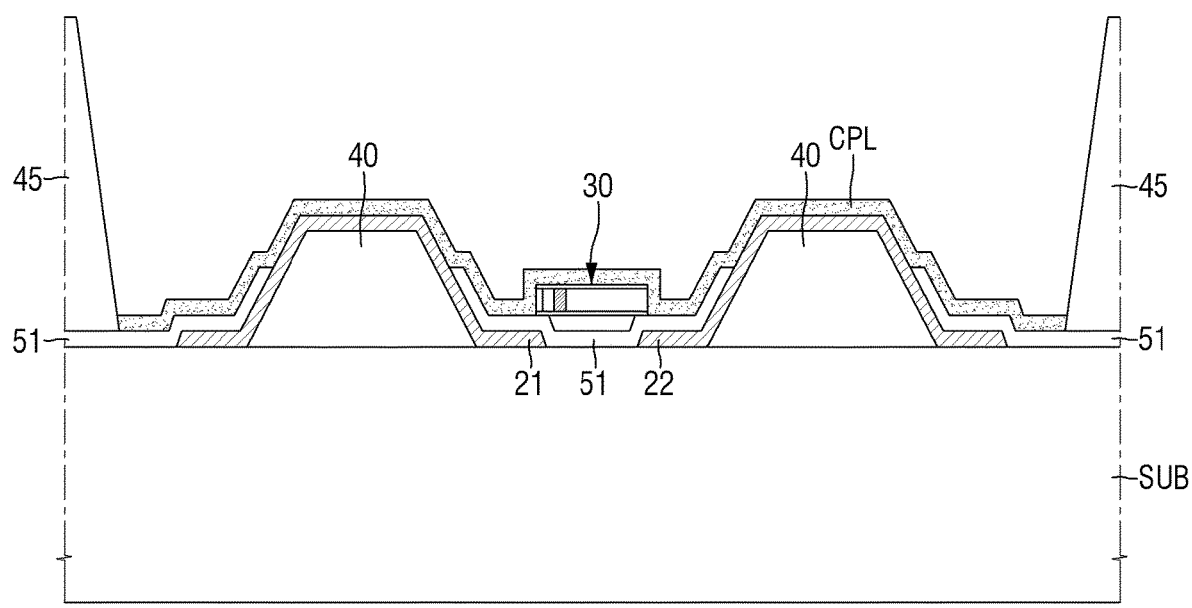

Next, referring to FIGS. 9 and 10, a conductive polymer solution PS is coated on the electrodes 21 and 22 and the light emitting elements 30 and then cured to form a conductive polymer layer CPL. In some embodiments, the conductive polymer solution PS may be coated through an inkjet printing process or a slit process. As described above, the conductive polymer solution PS may include PEDOT:PSS and may be coated on the electrodes 21 and 22 in a solution state. When the conductive polymer solution PS is cured, a single conductive polymer layer CPL including PEDOT:PSS may be formed. The conductive polymer layer CPL may anchor to the position of the light emitting elements 30 between the electrodes 21 and 22. In addition, the conductive polymer layer CPL may be placed to cover the light emitting elements 30 in addition to the first insulating layer 51, the first electrode 21 and the second electrode 22. The conductive polymer layer CPL may be partially removed in a subsequent process to form a plurality of contact electrodes 26 and 27.

Figure 11:
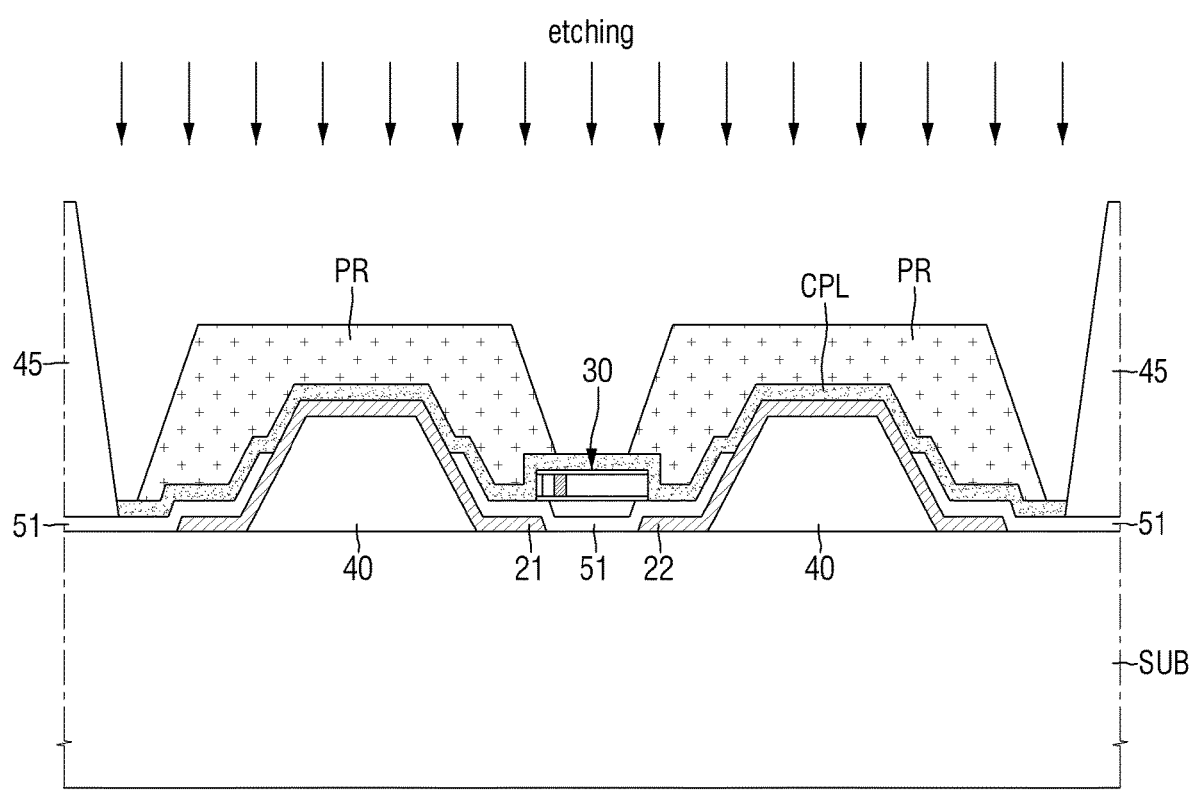
Figure 12:
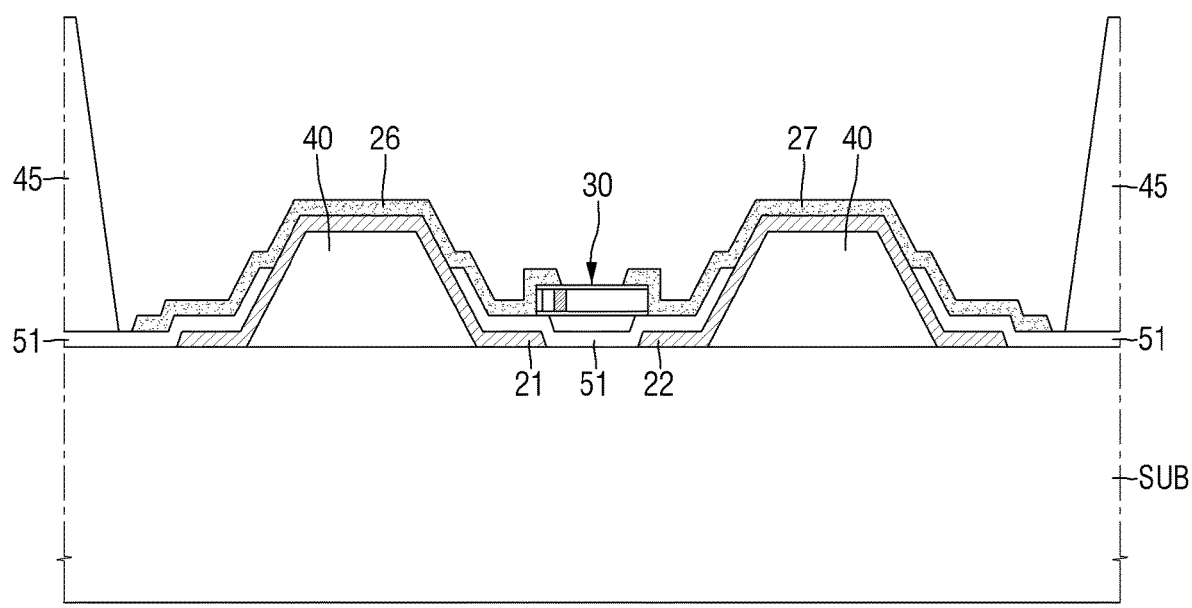

Next, referring to FIGS. 11 and 12, a photoresist layer PR is formed on the conductive polymer layer CPL and then partially removed to form a first contact electrode 26 and a second contact electrode 27. The process of forming the contact electrodes 26 and 27 may be performed through a process of forming the conductive polymer layer CPL to anchoring the position of the light emitting elements 30 while partially etching the conductive polymer layer CPL. The photoresist layer PR may be placed on the conductive polymer layer CPL and partially removed through an existing etching process. In some embodiments, a portion of the conductive polymer layer CPL which overlaps the light emitting elements 30 between the first electrode 21 and the second electrode 22 may be partially removed. The first contact electrode 26 and the second contact electrode 27 formed through the etching process may be spaced apart from each other in a part overlapping the light emitting elements 30. Thus, they may not be directly coupled to each other. Because the structure of the first contact electrode 26 and the second contact electrode 27 is the same as that described above, a duplicative description thereof will not be repeated here.

Next, in some embodiments, a second insulating layer 52 may be formed to complete the display device 10.

According to an embodiment, the contact electrodes 26 and 27 may include a conductive polymer, for example, PEDOT:PSS, and the process of anchoring the light emitting elements 30 and the process of forming the contact electrodes 26 and 27 in the fabrication process of the display device 10 may be performed through one etching process. Therefore, the number of processes required to fabricate the display device 10 can be reduced, thereby improving process efficiency.

Various embodiments of the display device 10 will now be described with reference to other drawings.

Figure 13:
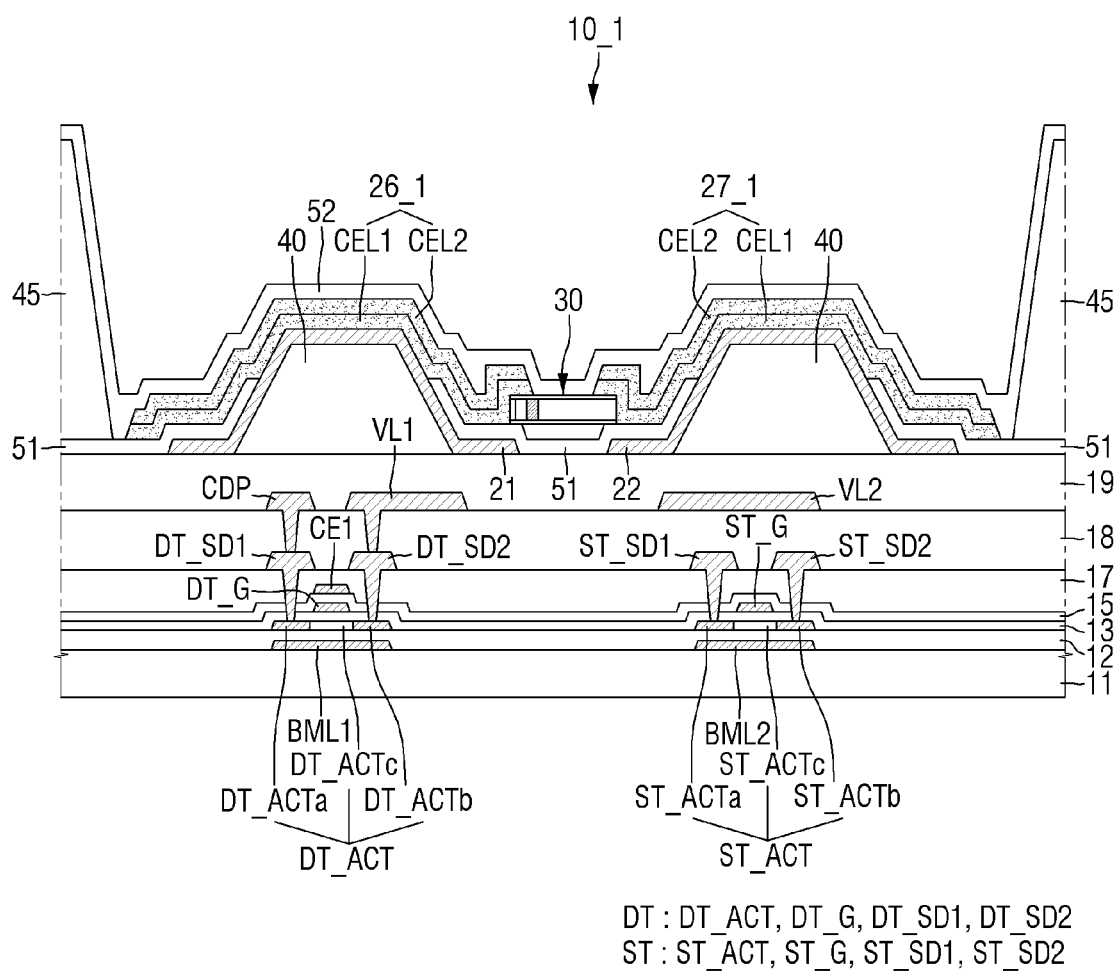
FIG. 13 is a cross-sectional view of a part of a display device according to an embodiment.
Figure 14:
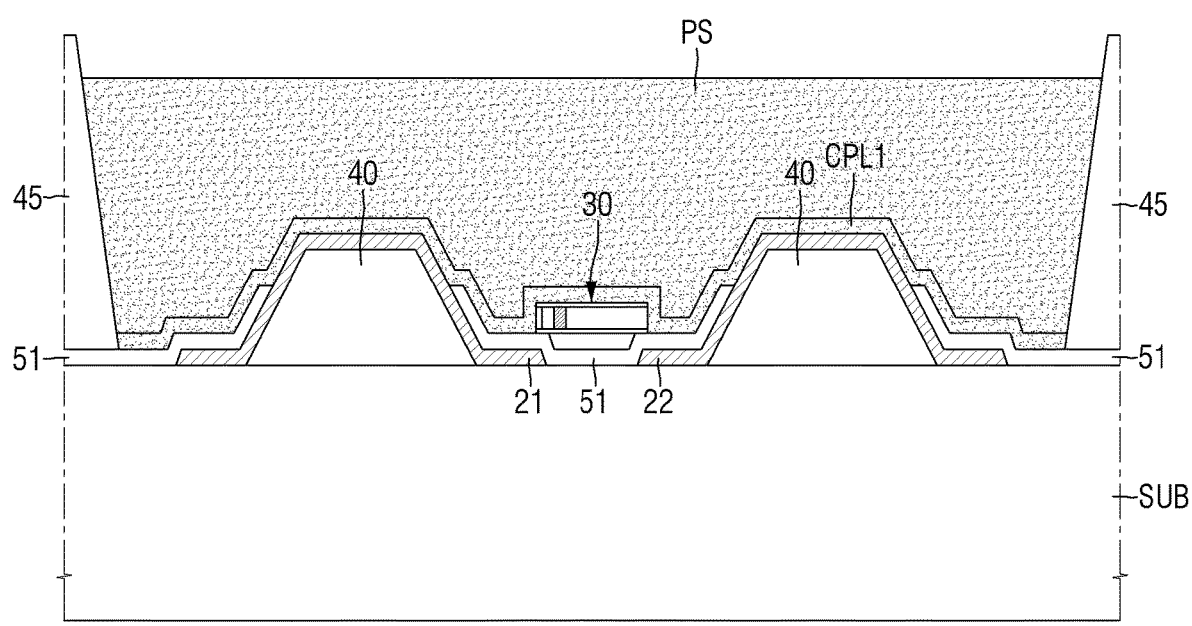
FIG. 14 is a cross-sectional view illustrating a part of a process of fabricating the display device of FIG. 13.

FIG. 13 is a cross-sectional view of a part of a display device 10_1 according to an embodiment. FIG. 14 is a cross-sectional view illustrating a part of a process of fabricating the display device 10_1 of FIG. 13.

Referring to FIGS. 13 and 14, in the display device 10_1 according to the embodiment, contact electrodes 26_1 and 27_1 including a conductive polymer may include a plurality of layers. In the fabrication process of the display device 10_1, a process of forming a conductive polymer layer CPL may be repeated a plurality of times, and each of the contact electrodes 26_1 and 27_1 may include a plurality of layers CEL1 and CEL2. The embodiment of FIGS. 13 and 14 is different from the embodiment of FIG. 3 in that each contact electrode 26_1 or 27_1 is composed of a plurality of layers CEL1 and CEL2. Hereinafter, any redundant description will not be repeated, and differences may be mainly described.

When the process of forming the conductive polymer layer CPL is performed only once during the fabrication process of the display device 10, the contact electrodes 26 and 27 formed as a result may be thin, and the material of the contact electrodes 26 and 27 may be partially broken by (e.g., at least partially separated by) a step between electrodes 21 and 22 and light emitting elements 30. In addition, as described above, the contact electrodes 26 and 27 may have a set or certain level of thickness in order to have high transmittance of light compared to low electrical resistivity. In some embodiments, each of the contact electrodes 26_1 and 27_1 may have a structure in which a plurality of layers CEL1 and CEL2 made of a conductive polymer are stacked.

In an embodiment, each of the contact electrodes 26_1 and 27_1 may include a first layer CEL1 and a second layer CEL2 including a conductive polymer. The first layer CEL1 and the second layer CEL2 may each include a PEDOT:PSS conductive polymer and may constitute one contact electrode 26_1 or 27_1. The sum of thicknesses of the first layer CEL1 and the second layer CEL2 may be adjusted within the thickness range of the contact electrode 26_1 or 27_1. According to an embodiment, in the display device 10_1, the number or thicknesses of the layers CEL1 and CEL2 including a conductive polymer may be variously modified according to the electrical resistivity and transmittance of light required of the contact electrode 26_1 or 27_1.

As illustrated in FIG. 14, after a first conductive polymer layer CPL1 is formed on the light emitting elements 30 and the electrodes 21 and 22, a process of coating a conductive polymer solution PS is performed once more. The conductive polymer solution PS is cured to form a second conductive polymer layer on the first conductive polymer layer CPL1, and then an etching process is performed using a photoresist layer PR. Accordingly, a plurality of conductive polymer layers CPL may respectively form a plurality of layers CEL1 and CEL2 and may constitute one contact electrode 26_1 or 27_1. According to an embodiment, in the fabrication process of the display device 10_1, the process of forming the conductive polymer layer CPL may be repeated a plurality of times, and each of the contact electrodes 26_1 and 27_1 may include a plurality of layers CEL1 and CEL2 including a conductive polymer. In the display device 10_1, because each of the contact electrodes 26_1 and 27_1 includes a plurality of layers CEL1 and CEL2, it can have a set or certain level of electrical resistivity and transmittance of light, and breakage of (separation of) the material of the contact electrodes 26_1 and 27_1 by the step formed by the light emitting elements 30 and the electrodes 21 and 22 can be prevented or reduced.

Figure 15:
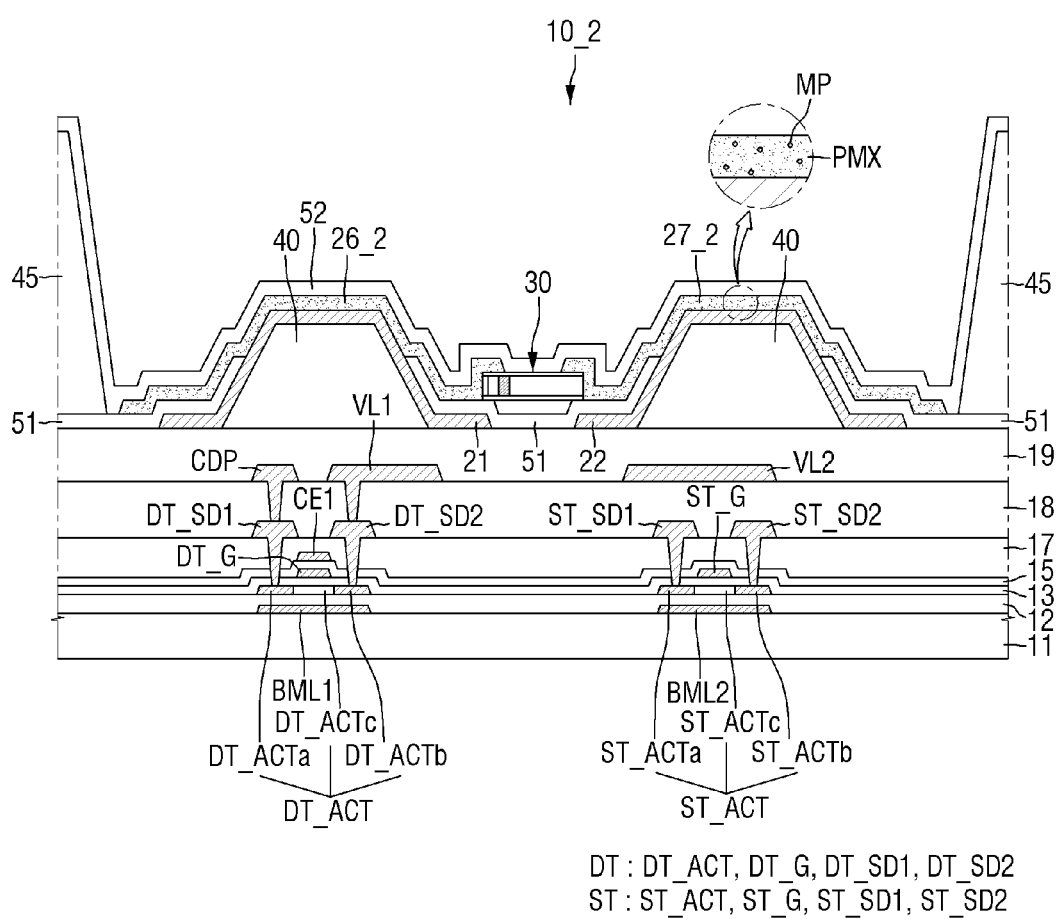
FIG. 15 is a cross-sectional view of a part of a display device according to an embodiment.

FIG. 15 is a cross-sectional view of a part of a display device 10_2 according to an embodiment.

Figure 16:
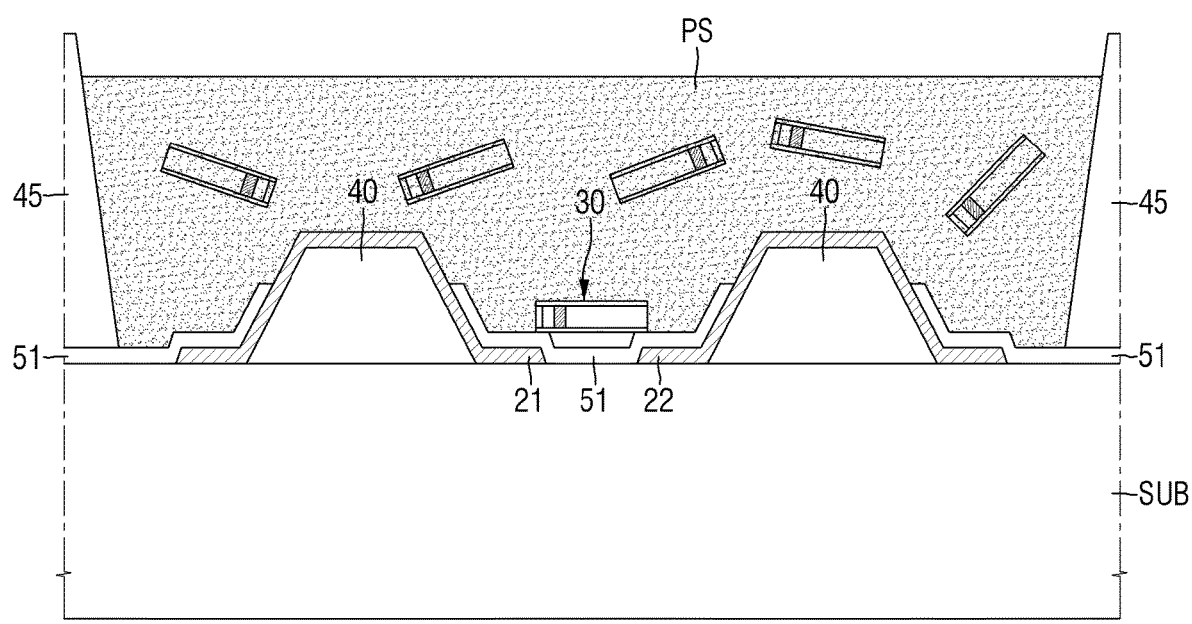
FIG. 16 is a cross-sectional view illustrating a part of a process of fabricating a display device according to an embodiment.

Referring to FIG. 15, in the display device 10_2 according to the embodiment, contact electrodes 26_2 and 27_2 may include a polymer matrix PMX made of a conductive polymer and metal particles MP dispersed in the polymer matrix PMX. To have higher electrical conductivity, the contact electrodes 26_2 and 27_2 may further include the metal particles MP which are a conductive material. The embodiment of FIGS. 15 and 16 is different from the embodiment of FIG. 3 in that the contact electrodes 26_2 and 27_2 further include the metal particles MP. Hereinafter, any redundant description will not be repeated, and differences may be mainly described.

As described above, the thickness or number of layers of each of the contact electrodes 26_2 and 27_2 of the display device 10_2 may be adjusted so that the contact electrodes 26_2 and 27_2 can have a certain level of electrical resistivity and transmittance of light. However, the present disclosure is not limited thereto, and the contact electrodes 26_2 and 27_2 may include the metal particles MP to further improve electrical conductivity. According to an embodiment, the conductive polymer included in each of the contact electrodes 26_2 and 27_2 may form the polymer matrix PMX, and a plurality of metal particles MP may be dispersed in the polymer matrix PMX. The polymer matrix PMX formed by the conductive polymer may itself have electrical conductivity, but its electrical resistivity may vary according to the thickness of the contact electrode 26_2 or 27_2 as described above. Each of the contact electrodes 26_2 and 27_2 including the metal particles MP dispersed in the polymer matrix PMX may have excellent electrical conductivity even though the polymer matrix PMX maintains a relatively small thickness.

In an exemplary embodiment, the metal particles MP may be any one or more selected from silver (Ag), copper (Cu), gold (Au), and aluminum (Al). In addition, in some embodiments, the metal particles MP may be spherical or plate-shaped particles or may be shaped like a wire or a rod. During the fabrication process of the display device 10_2, the metal particles MP dispersed in a conductive polymer solution PS may be coated on light emitting elements 30, and a conductive polymer layer CPL formed in a subsequent process may include the polymer matrix PMX made of a conductive polymer and the metal particles MP dispersed in the polymer matrix PMX. The metal particles MP dispersed in the polymer matrix PMX may improve the electrical conductivity of the contact electrodes 26_2 and 27_2, and the luminous efficiency of each pixel PX or subpixel PXn in the display device 10_2 may be improved.

The conductive polymer solution PS in which other particles as well as a conductive polymer are dispersed may be coated on electrodes 21 and 22. In some embodiments, the light emitting elements 30 may be dispersed in the conductive polymer solution PS and then sprayed onto the electrodes 21 and 22, thereby further reducing the number of processes required to fabricate the display device 10.

FIG. 16 is a cross-sectional view illustrating a part of a process of fabricating a display device 10 according to an embodiment.

Referring to FIG. 16, in the fabrication process of the display device 10 according to the embodiment, light emitting elements 30 may be dispersed in a conductive polymer solution PS and then sprayed onto electrodes 21 and 22. When an alignment signal is transmitted to the electrodes 21 and 22, an electric field may be formed in the conductive polymer solution PS, and the light emitting elements 30 may be arranged between the electrodes 21 and 22 by the electric field. Then, the conductive polymer solution PS may be cured to form a conductive polymer layer CPL, and the conductive polymer layer CPL may be partially etched to form contact electrodes 26 and 27.

According to the current embodiment, because an inkjet printing process is performed by dispersing the light emitting elements 30 in the conductive polymer solution PS during the fabrication process of the display device 10, an operation of spraying ink containing the light emitting elements 30 can be omitted. The light emitting elements 30 dispersed in the conductive polymer solution PS may be aligned between the electrodes 21 and 22 and may be anchored by curing the conductive polymer solution PS in a continuous process. For example, the number of processes required to fabricate the display device 10 can be further reduced.

Figure 17:
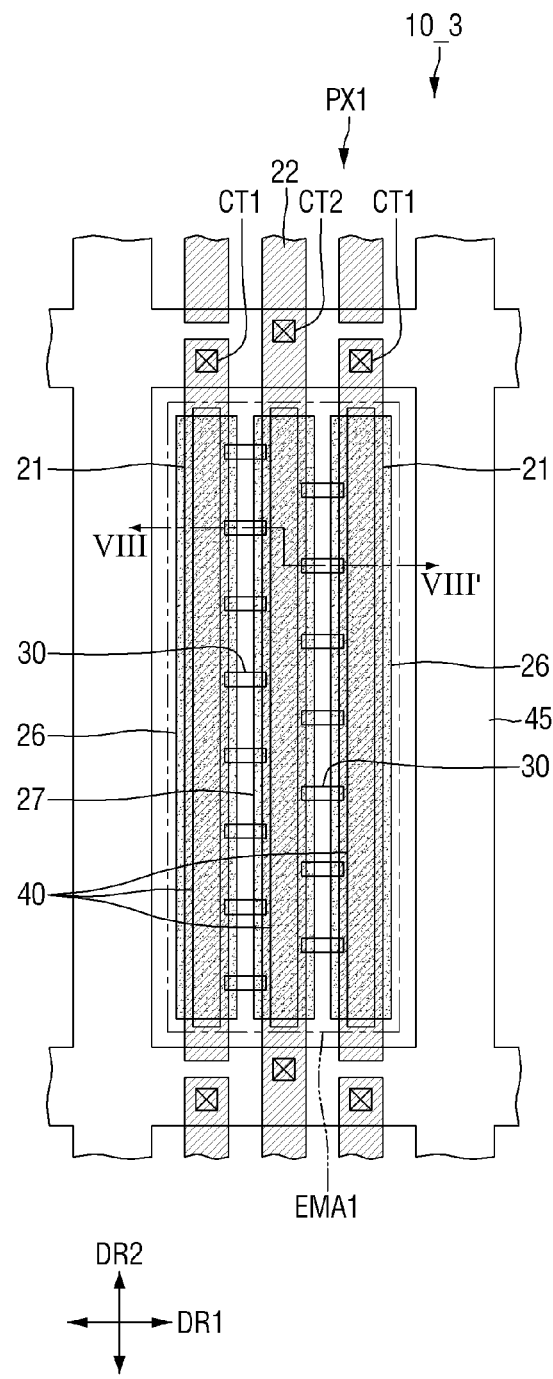
FIG. 17 is a plan view of a subpixel of a display device according to an embodiment.
Figure 18:
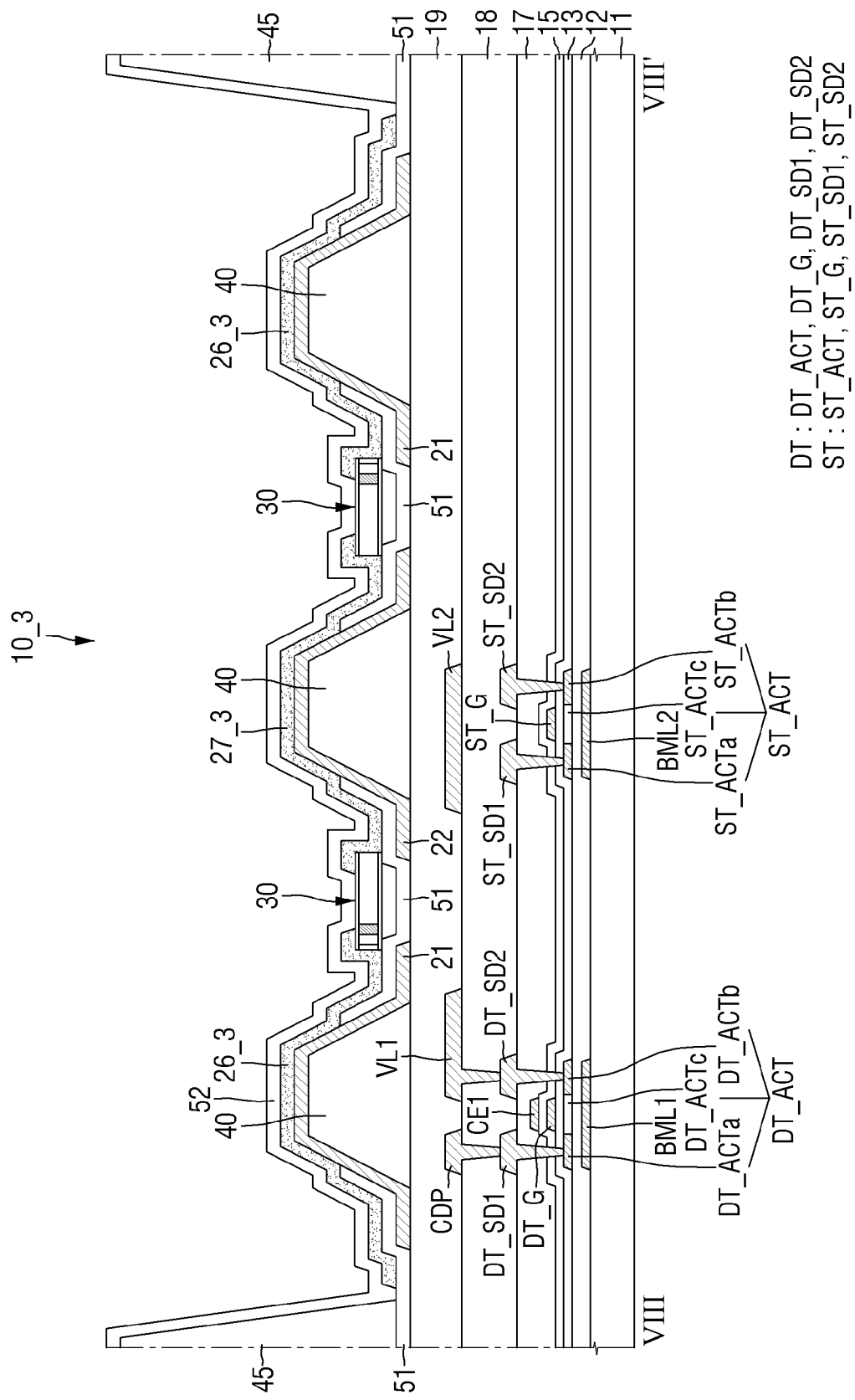
FIG. 18 is a cross-sectional view taken along line VIII-VIII' of FIG. 17.

FIG. 17 is a plan view of a subpixel PXn of a display device 10_3 according to an embodiment. FIG. 18 is a cross-sectional view taken along line VIII-VIII' of FIG. 17.

Referring to FIGS. 17 and 18, the display device 10_3 may include a greater number of electrodes 21 and 22, first banks 40, and contact electrodes 26 and 27. Each subpixel PXn of the display device 10_3 may include a plurality of first electrodes 21 and at least one second electrode 22 between the first electrodes 21. The first electrodes 21 and the second electrode 22 may be spaced apart to face each other in the first direction DR1 and may be alternately arranged along the first direction DR1 in each subpixel PXn. As the number of the electrodes 21 and 22 in each subpixel PXn increases, more first banks 40 may be on a first planarization layer 19, and more contact electrodes (contact electrodes 26 and 27 in FIG. 17 and contact electrodes 26_3 and 27_3 in FIG. 18) may be on the electrodes 21 and 22. In the drawings, because two first electrodes 21 and one second electrode 22 are in each subpixel PXn of the display device 10_3, three first banks 40, two first contact electrodes (two first contact electrodes 26 in FIG. 17 and two first contact electrodes 26_3 in FIG. 18) and one second contact electrode (one second contact electrode 27 in FIG. 17 and one second contact electrode in FIG. 18) are provided. However, the present disclosure is not limited thereto, and the numbers of the first banks 40, the electrodes 21 and 22, and the contact electrodes (contact electrodes 26 and 27 in FIG. 17 and contact electrodes 26_3 and 27_3 in FIG. 18) can be further increased.

According to an embodiment, in the display device 10_3, the number of light emitting elements 30 between the first electrodes 21 and the second electrode 22 may increase, leading to an increased amount of light emitted per unit pixel PX or subpixel PXn.

Each of the first electrodes 21 may contact a first conductive pattern CDP through a first contact hole CT1 and may be electrically coupled to a driving transistor DT through the first conductive pattern CDP. The light emitting elements 30 between one first electrode 21 and the second electrode 22 may form a parallel connection with the light emitting elements 30 between the other first electrode 21 and the second electrode 22. However, the present disclosure is not limited thereto. In some embodiments, the display device 10_3 may further include electrodes not directly coupled to circuit elements under the first planarization layer 19, and the light emitting elements 30 between the electrodes may form a series connection.

Figure 19:
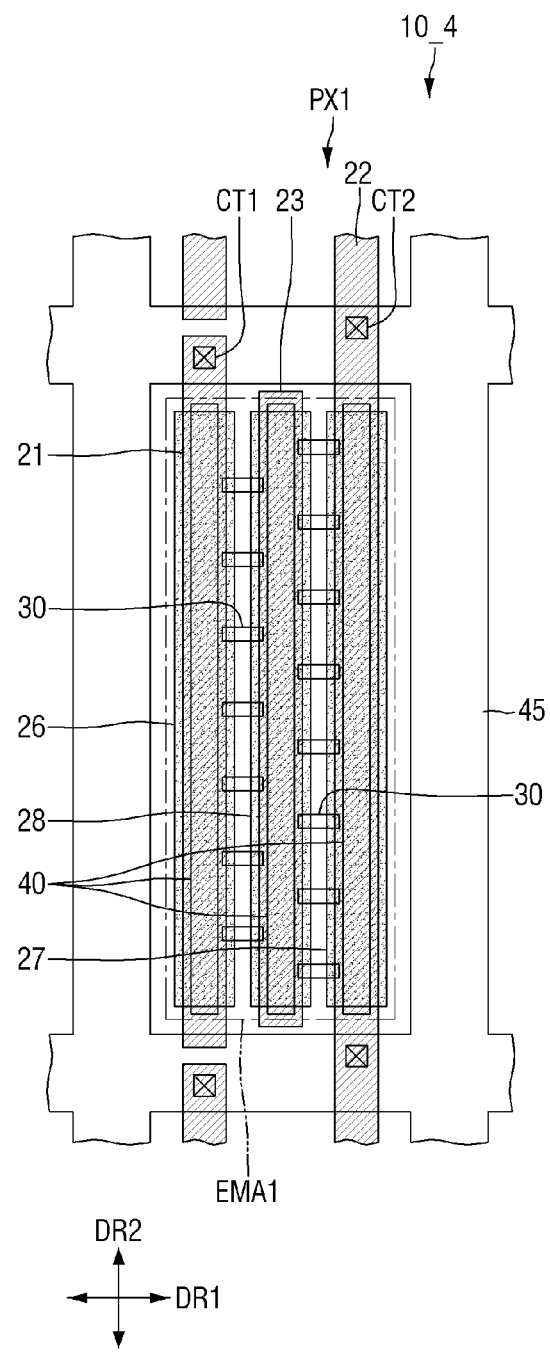
FIG. 19 is a plan view of a subpixel of a display device according to an embodiment.

FIG. 19 is a plan view of a subpixel PXn of a display device 10_4 according to an embodiment.

Referring to FIG. 19, the display device 10_4 according to the embodiment may further include a third electrode 23 between a first electrode 21 and a second electrode 22 in each subpixel PXn. In addition, contact electrodes 26 through 28 may further include a third contact electrode 28 on the third electrode 23. A first bank 40 may also be between the third electrode 23 and a first planarization layer 19, and a plurality of light emitting elements 30 may be between the first electrode 21 and the third electrode 23 and between the third electrode 23 and the second electrode 22. The current embodiment is different from the embodiment of FIG. 2 in that each subpixel PXn of the display device 10_4 further includes the third electrode 23 and the third contact electrode 28. Hereinafter, any redundant description will not be repeated, and the third electrode 23 will be described in more detail.

The third electrode 23 is between the first electrode 21 and the second electrode 22. A plurality of first banks 40, for example, three first banks 40 may be on the first planarization layer 19, and the first electrode 21, the third electrode 23 and the second electrode 22 may be sequentially on the first banks 40. The third electrode 23 may extend in the second direction DR2. Unlike the first electrode 21 and the second electrode 22, the third electrode 23 may extend in the second direction DR2 but may be spaced apart from a portion of a second bank 45 which extends in the first direction DR1 so as not to overlap the part of the second bank 45. For example, a length of the third electrode 23 measured in the second direction DR2 may be smaller than those of the first electrode 21 and the second electrode 22, and the third electrode 23 may not extend beyond a boundary with each neighboring subpixel PXn.

The light emitting elements 30 may be between the first electrode 21 and the third electrode 23 and between the third electrode 23 and the second electrode 22. The third contact electrode 28 may have the same (e.g., substantially the same) shape as a first contact electrode 26 and a second contact electrode 27 but may be on the third electrode 23. For example, the third contact electrode 28 may also include a conductive polymer.

Both ends of each light emitting element 30 between the first electrode 21 and the third electrode 23 may respectively contact the first contact electrode 26 and the third contact electrode 28 and thus be electrically coupled to the first electrode 21 and the third electrode 23. Both ends of each light emitting element 30 between the third electrode 23 and the second electrode 22 may respectively contact the third contact electrode 28 and the second contact electrode 27 and thus be electrically coupled to the third electrode 23 and the second electrode 22.

In addition, unlike the first electrode 21 and the second electrode 22, the third electrode 23 may not be directly coupled to a circuit element layer through a contact hole. Electrical signals transmitted to the first electrode 21 and the second electrode 22 may be transferred to the third electrode 23 through the first contact electrode 26, the second contact electrode 27 and the light emitting elements 30. For example, the light emitting elements 30 between the first electrode 21 and the third electrode 23 and the light emitting elements 30 between the third electrode 23 and the second electrode 22 may form a series connection. Because the display device 10_4 according to the embodiment further includes the third electrode 23, the light emitting elements 30 can form a series connection, and the luminous efficiency of each subpixel PXn can be further improved.

Figure 20:
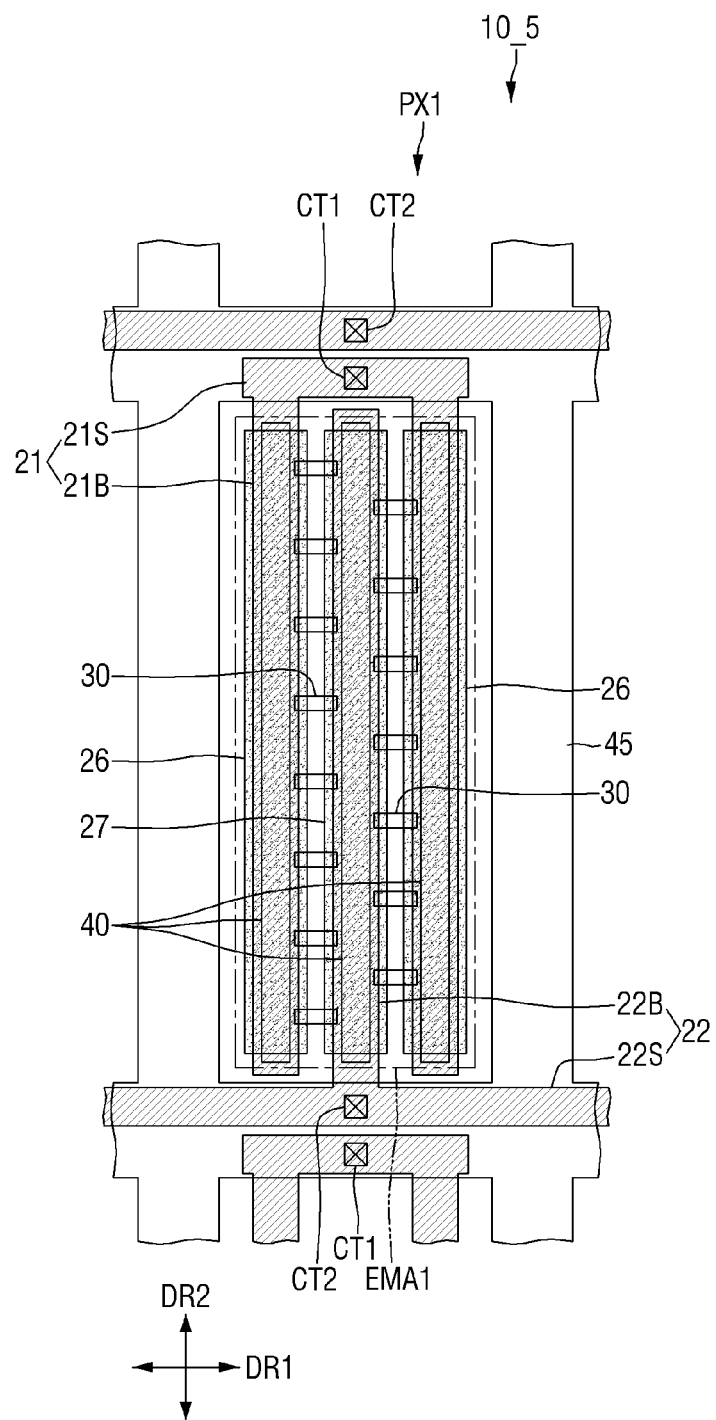
FIG. 20 is a plan view of a subpixel of a display device according to an embodiment.

FIG. 20 is a plan view of a subpixel PXn of a display device 10_5 according to an embodiment.

Referring to FIG. 20, in the display device 10_5 according to the embodiment, a first electrode 21 and a second electrode 22 may respectively include electrode stems 21S and 22S extending in the first direction DR1 and electrode branches 21B and 22B branching in the second direction DR2 from the electrode stems 21S and 22S. In an exemplary embodiment, the first electrode 21 may include a first electrode stem 21S extending in the first direction DR1 in each subpixel PXn and a plurality of first electrode branches 21B branching in the second direction DR2 from the first electrode stem 21S. The second electrode 22 may include a second electrode stem 22S extending in the first direction DR1 and over a plurality of subpixels PXn and at least one second electrode branch 22B branching in the second direction DR2 from the second electrode stem 22S in each subpixel PXn. The second electrode branch 22B may be between the first electrode branches 21B, and a plurality of light emitting elements 30 may be between them. The current embodiment is different from the embodiment of FIG. 2 in the shapes of the electrodes 21 and 22. Hereinafter, any redundant description will not be repeated, and the structure of the first electrode 21 and the second electrode 22 will be described in more detail.

The first electrode stem 21S and the second electrode stem 22S may extend in the first direction DR1. The first electrode stem 21S may not extend beyond a boundary with each subpixel PXn neighboring in the first direction DR1. For example, the first electrode stem 21S may overlap a portion of a second bank 45 which extends in the first direction DR1. The second electrode stem 22S may extend beyond the boundary with each subpixel PXn neighboring in the first direction DR1. One second electrode stem 22S may be over a plurality of subpixels PXn neighboring each other in the first direction DR1.

The first electrode stem 21S and the second electrode stem 22S may be spaced apart from each other in the second direction DR2 in each subpixel PXn. The first electrode stem 21S may be above a center of each subpixel PXn, and the second electrode stem 22S may be below the center of each subpixel PXn. However, the present disclosure is not limited thereto. Each of the first electrode stem 21S and the second electrode stem 22S may overlap the second bank 45, but the present disclosure is not limited thereto. In some embodiments, the first electrode stem 21S may be within each subpixel PXn and spaced apart from the second bank 45. The second electrode stem 22S may also extend in the first direction DR1 in each subpixel PXn and may be spaced apart from a portion of the second bank 45 which extends in the first direction DR1.

The first electrode branches 21B may branch in the second direction DR2 from the first electrode stem 21S but may be spaced apart from the second electrode stem 22S.

The second electrode branch 22B may branch in the second direction DR2 from the second electrode stem 22S but may be spaced apart from the first electrode stem 21S. In addition, the electrode branches 21B and 22B may be on first banks 40, respectively. In the drawing, two first electrode branches 21B and one second electrode branch 22B are in each subpixel PXn. The first electrode 21 may surround an outer surface of the second electrode branch 22B, but the present disclosure is not limited thereto. A greater number of the electrode branches 21B and 22B may also be in each subpixel PXn.

The first electrode stem 21S and the second electrode stem 22S may be electrically coupled to a first conductive pattern CDP and a second voltage wiring VL2 through a first contact hole CT1 and a second contact hole CT2, respectively. Electrical signals may be transmitted the first electrode branches 21B and the second electrode branch 22B through the electrode stems 21S and 22S, respectively.

A plurality of light emitting elements 30 may be between the first electrode branches 21B and the second electrode branch 22B, and a plurality of contact electrodes 26 and 27 may be on the first electrode branches 21B and the second electrode branch 22B. First contact electrodes 26 may be respectively on the first electrode branches 21B, and a second contact electrode 27 may be on the second electrode branch 22B. The remaining features are the same as those described above with reference to FIGS. 2 and 3.

Because the same electrical signal can be transmitted to the first electrode branches 21B through the first electrode stem 21S, the light emitting elements 30 between the electrode branches 21B and 22B may form a parallel connection with each other. In the display device 10_5 according to the current embodiment, because the number of the light emitting elements 30 in each subpixel PXn is increased, the amount of light emitted per unit pixel PX or subpixel PXn can be increased.

Figure 21:
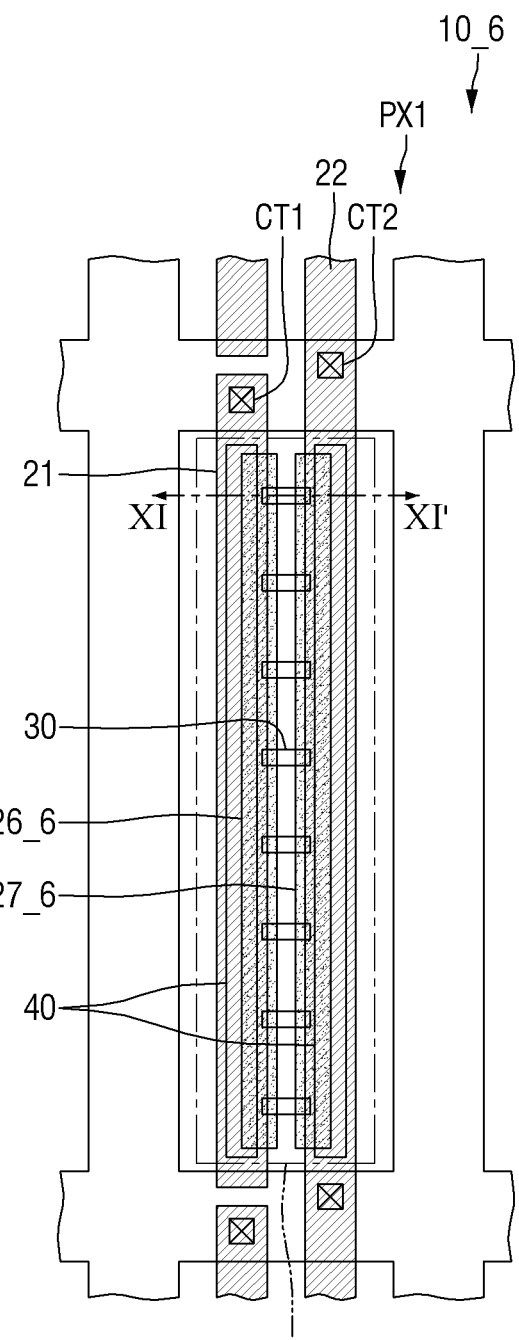
FIG. 21 is a plan view of a subpixel of a display device according to an embodiment.
Figure 22:
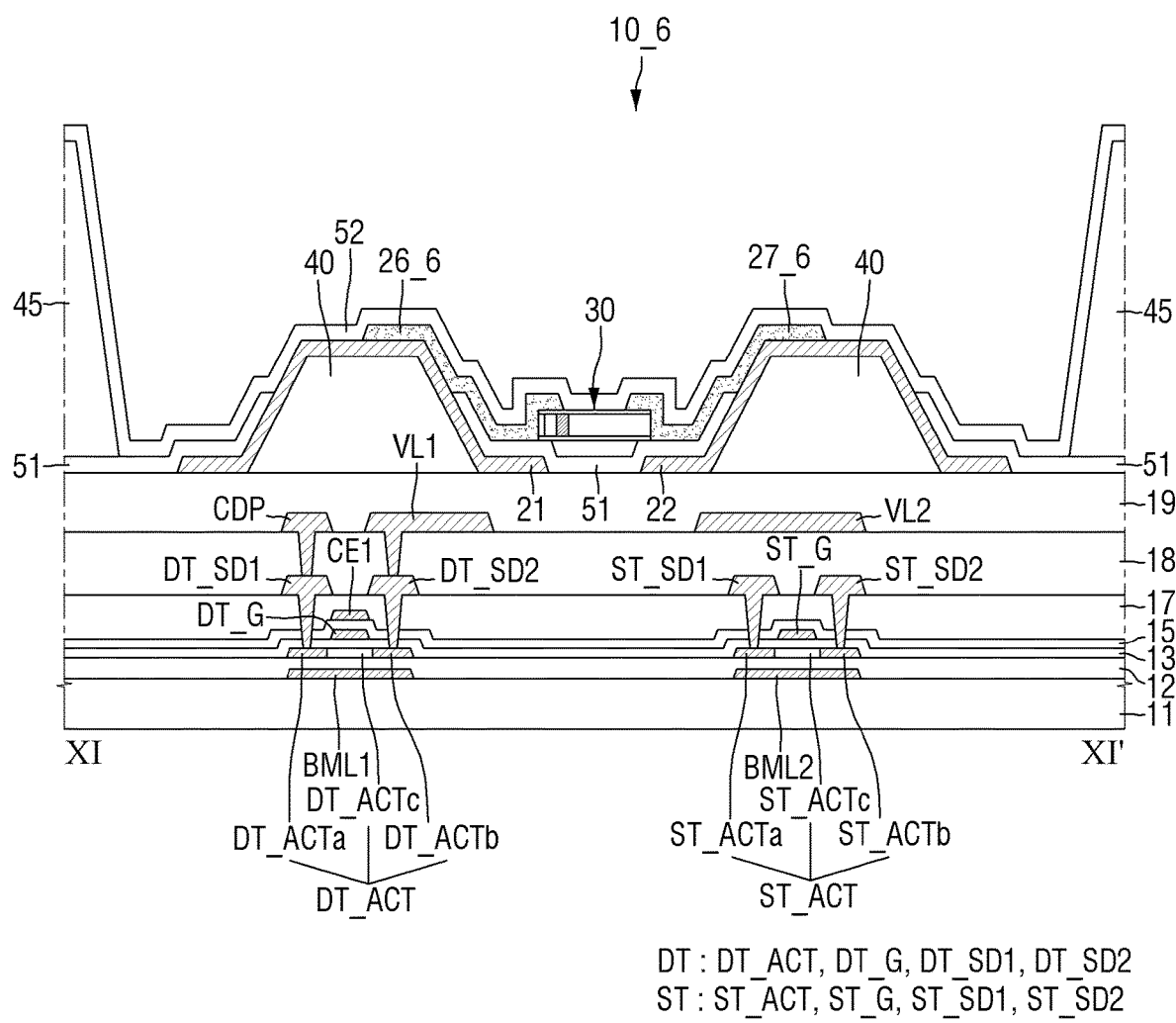
FIG. 22 is a cross-sectional view taken along line XI-XI' of FIG. 21.

FIG. 21 is a plan view of a subpixel PXn of a display device 10_6 according to an embodiment. FIG. 22 is a cross-sectional view taken along line XI-XI' of FIG. 21.

Referring to FIGS. 21 and 22, in the display device 10_6 according to the embodiment, widths of contact electrodes 26_6 and 27_6 may be smaller than widths of electrodes 21 and 22, respectively. The contact electrodes 26_6 and 27_6 may cover only exposed upper surfaces of the electrodes 21 and 22 on which a first insulating layer 51 is not provided. For example, a first contact electrode 26_6 may contact an end portion of each light emitting element 30 and a portion of an upper surface of a first electrode 21 and cover only a side of the first electrode 21 which faces a second electrode 22. A second contact electrode 27_6 may contact the other end portion of each light emitting element 30 and a portion of an upper surface of the second electrode 22 and cover only a side of the second electrode 22 which faces the first electrode 21. The widths of the contact electrodes 26_6 and 27_6 may be adjusted in the process of partially removing a conductive polymer layer CPL. The current embodiment is different from the embodiment of FIGS. 2 and 3 with respect to the widths of the contact electrodes 26_6 and 27_6. A display device according to an embodiment may include contact electrodes which are electrically coupled to a plurality of electrodes and light emitting elements and include a conductive polymer. The contact electrodes may be made of a polymer which is a transparent conductive material, and an operation of anchoring the light emitting elements during a process of fabricating the display device can be omitted.

In addition, a method of fabricating a display device according to an embodiment may include a process of coating a conductive polymer solution on light emitting elements to form contact electrodes in a state where the light emitting elements are anchored. According to an embodiment, the method of fabricating the display device may reduce the number of processes and may facilitate securing a process margin of the contact electrodes.

In concluding the detailed description, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation.

What is claimed is:

1. A method of fabricating a display device, the method comprising:
   preparing a target substrate, a first electrode and a second electrode on the target substrate, and light emitting elements, at least a portion of each of which is between the first electrode and the second electrode;
   coating a conductive polymer solution on the first electrode, the light emitting elements, and the second electrode; and
   forming contact electrodes by curing the conductive polymer solution,
   wherein the light emitting elements are dispersed in the conductive polymer solution and then on the first electrode and the second electrode.

2. The method of claim 1, wherein the contact electrodes comprise a first contact electrode which contacts an end portion of each of a first portion of the light emitting elements and the first electrode and a second contact electrode which contacts an end portion of each of a second portion of the light emitting elements, and
   wherein the second contact electrode and is spaced apart from the first contact electrode.

3. The method of claim 2, wherein the forming of the contact electrodes comprises:
   forming a conductive polymer layer by curing the conductive polymer solution; and
   forming the first contact electrode and the second contact electrode by partially removing the conductive polymer layer.

4. The method of claim 2, wherein the conductive polymer comprises PEDOT:PSS.

5. The method of claim 4, wherein the conductive polymer of each of the contact electrodes forms a polymer matrix, and silver (Ag) are particles dispersed in the polymer matrix.

* * * * *